(12) United States Patent
Andreev

(10) Patent No.: US 11,295,479 B2
(45) Date of Patent: Apr. 5, 2022

(54) BLENDSHAPE COMPRESSION SYSTEM

(71) Applicant: Electronic Arts Inc., Redwood City, CA (US)

(72) Inventor: Dmitry Andreevich Andreev, San Francisco, CA (US)

(73) Assignee: ELECTRONIC ARTS INC., Redwood City, CA (US)

(*) Notice: Subject to any disclaimer, the term of this patent is extended or adjusted under 35 U.S.C. 154(b) by 0 days.

(21) Appl. No.: 16/983,382

(22) Filed: Aug. 3, 2020

(65) Prior Publication Data

US 2021/0019916 A1 Jan. 21, 2021

Related U.S. Application Data

(63) Continuation of application No. 16/153,429, filed on Oct. 5, 2018, now Pat. No. 10,733,765, which is a continuation of application No. 15/475,576, filed on Mar. 31, 2017, now Pat. No. 10,096,133.

(51) Int. Cl.
*G06T 13/20* (2011.01)
*G06T 9/00* (2006.01)
(Continued)

(52) U.S. Cl.
CPC .................. *G06T 9/00* (2013.01); *G06T 9/20* (2013.01); *G06T 9/40* (2013.01); *H03M 7/30* (2013.01); *H03M 7/6064* (2013.01); *G06T 13/20* (2013.01)

(58) Field of Classification Search
None
See application file for complete search history.

(56) References Cited

U.S. PATENT DOCUMENTS 5,274,801 A 12/1993 Gordon
5,548,798 A 8/1996 King
(Continued)

FOREIGN PATENT DOCUMENTS

CN 102509272 A 6/2012
CN 103546736 A 1/2014
(Continued)

OTHER PUBLICATIONS

Seo J, Irving G, Lewis JP, Noh J. Compression and direct manipulation of complex blendshape models. In ACM Transactions on Graphics (TOG) Dec. 12, 2011 (vol. 30, No. 6, p. 164). ACM. (Year: 2011).*

(Continued)

*Primary Examiner* — Steven Z Elbinger
(74) *Attorney, Agent, or Firm* — Knobbe, Martens, Olson & Bear, LLP

(57) ABSTRACT

The systems and methods described herein can pre-process a blendshape matrix via a global clusterization process and a local clusterization process. The pre-processing can cause the blendshape matrix to be divided into multiple blocks. The techniques can further apply a matrix compression technique to each block of the blendshape matrix to generate a compression result. The matrix compression technique can comprise a matrix approximation step, an accuracy verification step, and a recursive compression step. The compression result for each block may be combined to generate a compressed blendshape matrix for rendering a virtual entity.

18 Claims, 14 Drawing Sheets

(51) Int. Cl.
*H03M 7/30* (2006.01)
*G06T 9/20* (2006.01)
*G06T 9/40* (2006.01)

(56) References Cited

U.S. PATENT DOCUMENTS

| | | | |
|---|---|---|---|
| 5,982,389 | A | 11/1999 | Guenter et al. |
| 5,999,195 | A | 12/1999 | Santangeli |
| 6,064,808 | A | 5/2000 | Kapur et al. |
| 6,088,040 | A | 7/2000 | Oda et al. |
| 6,253,193 | B1 | 6/2001 | Ginter et al. |
| 6,556,196 | B1 | 4/2003 | Blanz et al. |
| 6,961,060 | B1 | 11/2005 | Mochizuki et al. |
| 7,006,090 | B2 | 2/2006 | Mittring |
| 7,403,202 | B1 | 7/2008 | Nash |
| 7,415,152 | B2 | 8/2008 | Jiang et al. |
| 7,944,449 | B2 | 5/2011 | Petrovic et al. |
| 8,100,770 | B2 | 1/2012 | Yamazaki et al. |
| 8,142,282 | B2 | 3/2012 | Canessa et al. |
| 8,154,544 | B1 | 4/2012 | Cameron et al. |
| 8,207,971 | B1 | 6/2012 | Koperwas et al. |
| 8,267,764 | B1 | 9/2012 | Aoki et al. |
| 8,281,281 | B1 | 10/2012 | Smyrl et al. |
| 8,395,626 | B2 | 3/2013 | Millman |
| 8,398,476 | B1 | 3/2013 | Sidhu et al. |
| 8,406,528 | B1 | 3/2013 | Hatwich |
| 8,540,560 | B2 | 9/2013 | Crowley et al. |
| 8,599,206 | B2 | 12/2013 | Hodgins et al. |
| 8,624,904 | B1 | 1/2014 | Koperwas et al. |
| 8,648,863 | B1 | 2/2014 | Anderson et al. |
| 8,860,732 | B2 | 10/2014 | Popovic et al. |
| 8,914,251 | B2 | 12/2014 | Ohta |
| 9,117,134 | B1 | 8/2015 | Geiss et al. |
| 9,256,973 | B2 | 2/2016 | Koperwas et al. |
| 9,317,954 | B2 | 4/2016 | Li et al. |
| 9,483,860 | B2 | 11/2016 | Hwang et al. |
| 9,616,329 | B2 | 4/2017 | Szufnara et al. |
| 9,741,146 | B1 | 8/2017 | Nishimura |
| 9,811,716 | B2 | 11/2017 | Kim et al. |
| 9,826,898 | B1 | 11/2017 | Jin et al. |
| 9,858,700 | B2 | 1/2018 | Rose et al. |
| 9,947,123 | B1 | 4/2018 | Green |
| 9,984,658 | B2 | 5/2018 | Bonnier et al. |
| 9,990,754 | B1 | 6/2018 | Waterson et al. |
| 10,022,628 | B1 | 7/2018 | Matsumiya et al. |
| 10,096,133 | B1 | 10/2018 | Andreev |
| 10,118,097 | B2 | 11/2018 | Stevens |
| 10,198,845 | B1 | 2/2019 | Bhat et al. |
| 10,314,477 | B1 | 6/2019 | Goodsitt et al. |
| 10,388,053 | B1 | 8/2019 | Carter, Jr. et al. |
| 10,403,018 | B1 | 9/2019 | Worsham |
| 10,535,174 | B1 | 1/2020 | Rigiroli et al. |
| 10,726,611 | B1 | 7/2020 | Court |
| 10,733,765 | B2 | 8/2020 | Andreev |
| 10,755,466 | B2 | 8/2020 | Chamdani et al. |
| 10,792,566 | B1 | 10/2020 | Schmid |
| 10,856,733 | B2 | 12/2020 | Anderson et al. |
| 10,860,838 | B1 | 12/2020 | Elahie et al. |
| 10,878,540 | B1 | 12/2020 | Stevens |
| 10,902,618 | B2 | 1/2021 | Payne et al. |
| 11,113,860 | B2 | 9/2021 | Rigiroli et al. |
| 2002/0054054 | A1 | 5/2002 | Sanbe |
| 2002/0089504 | A1 | 7/2002 | Merrick et al. |
| 2002/0180739 | A1 | 12/2002 | Reynolds et al. |
| 2003/0038818 | A1 | 2/2003 | Tidwell |
| 2004/0027352 | A1 | 2/2004 | Minakuchi |
| 2004/0227760 | A1 | 11/2004 | Anderson et al. |
| 2004/0227761 | A1 | 11/2004 | Anderson et al. |
| 2005/0237550 | A1 | 10/2005 | Hu |
| 2006/0036514 | A1 | 2/2006 | Steelberg et al. |
| 2006/0149516 | A1 | 7/2006 | Bond et al. |
| 2006/0217945 | A1 | 9/2006 | Leprevost |
| 2006/0262114 | A1 | 11/2006 | Leprevost |
| 2007/0085851 | A1 | 4/2007 | Muller et al. |
| 2007/0097125 | A1 | 5/2007 | Xie et al. |
| 2008/0049015 | A1 | 2/2008 | Elmieh et al. |
| 2008/0111831 | A1 | 5/2008 | Son et al. |
| 2008/0152218 | A1 | 6/2008 | Okada |
| 2008/0268961 | A1 | 10/2008 | Brook |
| 2008/0316202 | A1 | 12/2008 | Zhou et al. |
| 2009/0066700 | A1 | 3/2009 | Harding et al. |
| 2009/0315839 | A1 | 12/2009 | Wilson et al. |
| 2010/0134501 | A1 | 6/2010 | Lowe et al. |
| 2010/0251185 | A1 | 9/2010 | Pattenden |
| 2010/0277497 | A1 | 11/2010 | Dong et al. |
| 2011/0012903 | A1 | 1/2011 | Girard |
| 2011/0074807 | A1 | 3/2011 | Inada et al. |
| 2011/0086702 | A1 | 4/2011 | Borst et al. |
| 2011/0119332 | A1 | 5/2011 | Marshall et al. |
| 2011/0128292 | A1 | 6/2011 | Ghyme et al. |
| 2011/0164831 | A1 | 7/2011 | Van Reeth et al. |
| 2011/0187731 | A1 | 8/2011 | Tsuchida |
| 2011/0269540 | A1 | 11/2011 | Gillo et al. |
| 2011/0292055 | A1 | 12/2011 | Hodgins et al. |
| 2012/0083330 | A1 | 4/2012 | Ocko |
| 2012/0115580 | A1 | 5/2012 | Hornik et al. |
| 2012/0220376 | A1 | 8/2012 | Takayama et al. |
| 2012/0244941 | A1 | 9/2012 | Ostergren et al. |
| 2012/0303343 | A1 | 11/2012 | Sugiyama et al. |
| 2012/0313931 | A1 | 12/2012 | Matsuike et al. |
| 2013/0050464 | A1 | 2/2013 | Kang |
| 2013/0063555 | A1 | 3/2013 | Matsumoto et al. |
| 2013/0120439 | A1 | 5/2013 | Harris et al. |
| 2013/0121618 | A1 | 5/2013 | Yadav |
| 2013/0222433 | A1 | 8/2013 | Chapman et al. |
| 2013/0235045 | A1 | 9/2013 | Corazza et al. |
| 2013/0263027 | A1 | 10/2013 | Petschnigg et al. |
| 2013/0311885 | A1 | 11/2013 | Wang et al. |
| 2014/0002463 | A1 | 1/2014 | Kautzman et al. |
| 2014/0198106 | A1 | 7/2014 | Sumner et al. |
| 2014/0198107 | A1 | 7/2014 | Thomaszewski et al. |
| 2014/0327694 | A1 | 11/2014 | Cao et al. |
| 2015/0113370 | A1 | 4/2015 | Flider |
| 2015/0126277 | A1 | 5/2015 | Aoyagi |
| 2015/0187113 | A1 | 7/2015 | Rubin et al. |
| 2015/0235351 | A1 | 8/2015 | Mirbach et al. |
| 2015/0243326 | A1 | 8/2015 | Pacurariu et al. |
| 2015/0381925 | A1 | 12/2015 | Varanasi et al. |
| 2016/0026926 | A1 | 1/2016 | Yeung et al. |
| 2016/0042548 | A1* | 2/2016 | Du ................ G06T 7/251 |
| | | | 345/473 |
| 2016/0071470 | A1 | 3/2016 | Kim et al. |
| 2016/0217723 | A1 | 7/2016 | Kim et al. |
| 2016/0307369 | A1 | 10/2016 | Freedman et al. |
| 2016/0314617 | A1 | 10/2016 | Forster et al. |
| 2016/0354693 | A1 | 12/2016 | Yan et al. |
| 2017/0132827 | A1* | 5/2017 | Tena ................ G06T 13/40 |
| 2017/0301310 | A1 | 10/2017 | Bonnier et al. |
| 2017/0301316 | A1 | 10/2017 | Farell |
| 2018/0122125 | A1 | 5/2018 | Brewster |
| 2018/0165864 | A1 | 6/2018 | Jin et al. |
| 2018/0211102 | A1 | 7/2018 | Alsmadi |
| 2018/0239526 | A1* | 8/2018 | Varanasi ............. G06F 3/041 |
| 2019/0392587 | A1 | 12/2019 | Nowozin et al. |
| 2020/0294299 | A1 | 9/2020 | Rigiroli et al. |
| 2021/0217184 | A1 | 7/2021 | Payne et al. |
| 2021/0252403 | A1 | 8/2021 | Stevens |

FOREIGN PATENT DOCUMENTS

| | | |
|---|---|---|
| CN | 105405380 A | 3/2016 |
| CN | 105825778 A | 8/2016 |
| JP | 2018-520820 A | 8/2018 |
| JP | 2019-162400 A | 9/2019 |

OTHER PUBLICATIONS

Anagnostopoulos et al., "Intelligent modification for the daltonization process", International Conference on Computer Vision Published in 2007 by Applied Computer Science Group of digitized paintings.

(56) References Cited

OTHER PUBLICATIONS

Andersson, S., Goransson, J.: Virtual Texturing with WebGL. Master's thesis, Chalmers University of Technology, Gothenburg, Sweden (2012).

Avenali, Adam, "Color Vision Deficiency and Video Games", The Savannah College of Art and Design, Mar. 2013.

Badlani et al., "A Novel Technique for Modification of Images for Deuteranopic Viewers", May 2016.

Belytschko et al., "Assumed strain stabilization of the eight node hexahedral element," Computer Methods in Applied Mechanics and Engineering, vol. 105(2), pp. 225-260 (1993), 36 pages.

Belytschko et al., Nonlinear Finite Elements for Continua and Structures, Second Edition, Wiley (Jan. 2014), 727 pages (uploaded in 3 parts).

Blanz V, Vetter T. A morphable model for the synthesis of 3D faces. In Proceedings of the 26th annual conference on Computer graphics and interactive techniques Jul. 1, 1999 (pp. 187-194). ACM Press/Addison-Wesley Publishing Co.

Blanz et al., "Reanimating Faces in Images and Video" Sep. 2003, vol. 22, No. 3, pp. 641-650, 10 pages.

Chao et al., "A Simple Geometric Model for Elastic Deformations", 2010, 6 pgs.

Cook et al., Concepts and Applications of Finite Element Analysis, 1989, Sections 6-11 through 6-14.

Cournoyer et al., "Massive Crowd on Assassin's Creed Unity: AI Recycling," Mar. 2, 2015, 55 pages.

Dick et al., "A Hexahedral Multigrid Approach for Simulating Cuts in Deformable Objects", IEEE Transactions on Visualization and Computer Graphics, vol. X, No. X, Jul. 2010, 16 pgs.

Diziol et al., "Robust Real-Time Deformation of Incompressible Surface Meshes", to appear in Proceedings of the 2011 ACM SIGGRAPH/Eurographics Symposium on Computer Animation (2011), 10 pgs.

Dudash, Bryan. "Skinned instancing." NVidia white paper(2007).

Fikkan, Eirik. Incremental loading of terrain textures. MS thesis. Institutt for datateknikk og informasjonsvitenskap, 2013.

Geijtenbeek, T. et al., "Interactive Character Animation using Simulated Physics", Games and Virtual Worlds, Utrecht University, The Netherlands, The Eurographics Association 2011, 23 pgs.

Georgii et al., "Corotated Finite Elements Made Fast and Stable", Workshop in Virtual Reality Interaction and Physical Simulation VRIPHYS (2008), 9 pgs.

Halder et al., "Image Color Transformation for Deuteranopia Patients using Daltonization", IOSR Journal of VLSI and Signal Processing (IOSR-JVSP) vol. 5, Issue 5, Ver. I (Sep.-Oct. 2015), pp. 15-20.

Han et al., "On-line Real-time Physics-based Predictive Motion Control with Balance Recovery," Eurographics, vol. 33(2), 2014, 10 pages.

Hernandez, Benjamin, et al. "Simulating and visualizing real-time crowds on GPU clusters." Computación y Sistemas 18.4 (2014): 651-664.

Hu G, Chan CH, Yan F, Christmas W, Kittler J. Robust face recognition by an albedo based 3D morphable model. In Biometrics (IJCB), 2014 IEEE International Joint Conference on Sep. 29, 2014 (pp. 1-8). IEEE.

Hu Gousheng, Face Analysis using 3D Morphable Models, Ph.D. Thesis, University of Surrey, Apr. 2015, pp. 1-112.

Irving et al., "Invertible Finite Elements for Robust Simulation of Large Deformation", Eurographics/ACM SIGGRAPH Symposium on Computer Animation (2004), 11 pgs.

Kaufmann et al., "Flexible Simulation of Deformable Models Using Discontinuous Galerkin FEM", Oct. 1, 2008, 20 pgs.

Kavan et al., "Skinning with Dual Quaternions", 2007, 8 pgs.

Kim et al., "Long Range Attachments—A Method to Simulate Inextensible Clothing in Computer Games", Eurographics/ACM SIGGRAPH Symposium on Computer Animation (2012), 6 pgs.

Klein, Joseph. Rendering Textures Up Close in a 3D Environment Using Adaptive Micro-Texturing. Diss. Mills College, 2012.

Komura et al., "Animating reactive motion using momentum-based inverse kinematics," Computer Animation and Virtual Worlds, vol. 16, pp. 213-223, 2005, 11 pages.

Lee, Y. et al., "Motion Fields for Interactive Character Animation", University of Washington, Bungie, Adobe Systems, 8 pgs, obtained Mar. 20, 2015.

Levine, S. et al., "Continuous Character Control with Low-Dimensional Embeddings", Stanford University, University of Washington, 10 pgs, obtained Mar. 20, 2015.

Macklin et al., "Position Based Fluids", to appear in ACM TOG 32(4), 2013, 5 pgs.

McAdams et al., "Efficient Elasticity for Character Skinning with Contact and Collisions", 2011, 11 pgs.

McDonnell, Rachel, et al. "Clone attack! perception of crowd variety." ACM Transactions on Graphics (TOG). vol. 27. No. 3. ACM, 2008.

Muller et al., "Meshless Deformations Based on Shape Matching", SIGGRAPH 2005, 29 pgs.

Muller et al., "Adding Physics to Animated Characters with Oriented Particles", Workshop on Virtual Reality Interaction and Physical Simulation VRIPHYS (2011), 10 pgs.

Muller et al., "Real Time Dynamic Fracture with Columetric Approximate Convex Decompositions", ACM Transactions of Graphics, Jul. 2013, 11 pgs.

Muller et al., "Position Based Dymanics", VRIPHYS 2006, Oct. 21, 2014, Computer Graphics, Korea University, 23 pgs.

Musse, Soraia Raupp, and Daniel Thalmann. "Hierarchical model for real time simulation of virtual human crowds." IEEE Transactions on Visualization and Computer Graphics 7.2 (2001): 152-164.

Nguyen et al., "Adaptive Dynamics With Hybrid Response," 2012, 4 pages.

O'Brien et al., "Graphical Modeling and Animation of Brittle Fracture", GVU Center and College of Computing, Georgia Institute of Technology, Reprinted from the Proceedings of ACM SIGGRAPH 99, 10 pgs, dated 1999.

Orin et al., "Centroidal dynamics of a humanoid robot," Auton Robot, vol. 35, pp. 161-176, 2013, 18 pages.

Parker et al., "Real-Time Deformation and Fracture in a Game Environment", Eurographics/ACM SIGGRAPH Symposium on Computer Animation (2009), 12 pgs.

Pelechano, Nuria, Jan M. Allbeck, and Norman I. Badler. "Controlling individual agents in high-density crowd simulation." Proceedings of the 2007 ACM SIGGRAPH/Eurographics symposium on Computer animation. Eurographics Association, 2007. APA.

Rivers et al., "FastLSM: Fast Lattice Shape Matching for Robust Real-Time Deformation", ACM Transactions on Graphics, vol. 26, No. 3, Article 82, Publication date: Jul. 2007, 6 pgs.

Ruiz, Sergio, et al. "Reducing memory requirements for diverse animated crowds." Proceedings of Motion on Games. ACM, 2013.

Rungjiratananon et al., "Elastic Rod Simulation by Chain Shape Matching withTwisting Effect" SIGGRAPH Asia 2010, Seoul, South Korea, Dec. 15-18, 2010, ISBN 978-1-4503-0439-9/10/0012, 2 pgs.

Seo et al., "Compression and Direct Manipulation of Complex Blendshape Models", Dec. 2011, in 10 pgs.

Sifakis, Eftychios D., "FEM Simulations of 3D Deformable Solids: A Practioner's Guide to Theory, Discretization and Model Reduction. Part One: The Classical FEM Method and Discretization Methodology", SIGGRAPH 2012 Course, Version 1.0 [Jul. 10, 2012], 50 pgs.

Stomakhin et al., "Energetically Consistent Invertible Elasticity", Eurographics/ACM SIGRAPH Symposium on Computer Animation (2012), 9 pgs.

Thalmann, Daniel, and Soraia Raupp Musse. "Crowd rendering." Crowd Simulation. Springer London, 2013. 195-227.

Thalmann, Daniel, and Soraia Raupp Musse. "Modeling of Populations." Crowd Simulation. Springer London, 2013. 31-80.

Treuille, A. et al., "Near-optimal Character Animation with Continuous Control", University of Washington, 2007, 7 pgs.

Ulicny, Branislav, and Daniel Thalmann. "Crowd simulation for interactive virtual environments and VR training systems." Computer Animation and Simulation 2001 (2001 ): 163-170.

(56) References Cited

OTHER PUBLICATIONS

Vaillant et al., "Implicit Skinning: Real-Time Skin Deformation with Contact Modeling", (2013) ACM Transactions on Graphics, vol. 32 (n° 4). pp. 1-11. ISSN 0730-0301, 12 pgs.
Vigueras, Guillermo, et al. "A distributed visualization system for crowd simulations." Integrated Computer-Aided Engineering 18.4 (2011): 349-363.
Wu et al., "Goal-Directed Stepping with Momentum Control," Eurographics/ ACM SIGGRAPH Symposium on Computer Animation, 2010, 6 pages.
Habibie et al., "A Recurrent Variational Autoencoder for Human Motion Synthesis", 2017, in 12 pages.

* cited by examiner

BLENDSHAPE COMPRESSION SYSTEM

INCORPORATION BY REFERENCE TO ANY PRIORITY APPLICATIONS

Any and all applications for which a foreign or domestic priority claim is identified in the Application Data Sheet as filed with the present application are incorporated by reference under 37 CFR 1.57 and made a part of this specification.

BACKGROUND

The blendshapes method is a technique for the creation of realistic and semi-realistic three-dimensional (3D) animation. The blendshapes method can deform a neutral shape (for example, an expressionless face) of a virtual entity to a target shape (for example, laugh, frown, pursed lips, closed eyelids, and so forth). Typically, each target shape deforms only a part of the virtual entity. Blendshapes associated with different parts of the virtual entity can be mixed and matched to form a number of poses. For example, a frown can be mixed with a smile to form an apologetic expression. A blendshape with pursed lips can be mixed with frowning eyes to form an expression of determination or a look of disapproval.

To provide a high quality of animation, the blendshapes method often requires a large number of target shapes to represent poses in detail. Due to this large number of the target shapes, it is difficult to achieve real-time performance using the blendshape method.

SUMMARY OF EMBODIMENTS

The systems, methods, and devices of this disclosure each have several innovative aspects, no single one of which is solely responsible for various desirable attributes disclosed herein.

A computer-implemented method for compressing a blendshape matrix associated with animating a three-dimensional virtual entity during runtime execution of a game application, comprising: under control of one or more hardware computing devices configured with specific computer-executable instructions, the specific computer-executable instructions stored in an electronic hardware memory, accessing a blendshape matrix associated with animating a three-dimensional virtual entity; dividing the blendshape matrix into a plurality of block matrixes, wherein each block matrix is a subset of the blendshape matrix; for each block matrix of the plurality of block matrixes: dividing the block matrix into a plurality of compressed submatrixes using a recursive division routine, wherein the block matrix is a parent matrix in a first stage of the recursive division routine, wherein each stage of the recursive division routine comprises: dividing a parent matrix into a plurality of submatrixes; compressing the parent matrix to generate a first compression result using a matrix approximation algorithm; compressing the plurality of submatrixes to generate a second compression result using the matrix approximation algorithm; determining whether a first compression ratio of the first compression result is an improvement over a second compression ratio of the second compression result; in response to a determination that the first compression ratio is an improvement over the second compression ratio, outputting the first compression result as a compressed submatrix of the plurality of compressed submatrixes; and in response to a determination that the first compression ratio is not an improvement over the second compression ratio, performing a subsequent stage of the recursive division routine on each submatrix of the plurality of submatrixes, wherein in the subsequent stage of the recursive division routine each submatrix is a parent matrix; and combining the plurality of compressed submatrixes into a compressed blendshape output; and storing the compressed blendshape output on the hardware computing device for real-time rendering of the three dimensional virtual entity in a game application.

A computer system comprising: a hardware processor in communication with the electronic data store, the hardware processor configured to execute specific computer-executable instructions to at least: divide a blendshape matrix into a plurality of block matrixes; for each block matrix of the plurality of block matrixes: divide the block matrix into a plurality of compressed submatrixes using a recursive division routine, wherein the block matrix is a parent matrix in a first stage of the recursive division routine, wherein each stage of the recursive division routine is configured to: divide a parent matrix into a plurality of submatrixes; compress the parent matrix to generate a first compression result using a matrix approximation algorithm; compress the plurality of submatrixes to generate a second compression result using the matrix approximation algorithm; determine whether a first compression ratio of the first compression result is an improvement over a second compression ratio of the second compression result; in response to a determination that the first compression ratio is an improvement over the second compression ratio, output the first compression result as a compressed submatrix of the plurality of compressed submatrixes; and in response to a determination that the first compression ratio is not an improvement over the second compression ratio, perform a subsequent stage of the recursive division routine on each submatrix of the plurality of submatrixes, wherein in the subsequent stage of the recursive division routine each submatrix is a parent matrix; and combine the plurality of compressed submatrixes into a compressed blendshape output; and store the compressed blendshape output in a data store of the computing system for real-time rendering of the three dimensional virtual entity in a game application.

A non-transitory computer-readable storage medium storing computer executable instructions that, when executed by one or more computing devices, configure the one or more computing devices to perform operations comprising: under control of one or more hardware computing devices configured with specific computer-executable instructions, the specific computer-executable instructions stored in an electronic hardware memory, dividing a blendshape matrix into a plurality of block matrixes; for each block matrix of the plurality of block matrixes: dividing the block matrix into a plurality of compressed submatrixes using a recursive division routine, wherein the block matrix is a parent matrix in a first stage of the recursive division routine, wherein each stage of the recursive division routine comprises: dividing a parent matrix into a plurality of submatrixes; compressing the parent matrix to generate a first compression result using a matrix approximation algorithm; compressing the plurality of submatrixes to generate a second compression result using the matrix approximation algorithm; determining whether a first compression ratio of the first compression result is an improvement over a second compression ratio of the second compression result; in response to a determination that the first compression ratio is an improvement over the second compression ratio, outputting the first compression result as a compressed submatrix of the plurality of compressed submatrixes; and in response to a determination that the first compression ratio is not an improvement over the second compression ratio, performing a subsequent stage of the recursive division routine on each submatrix of the plurality of submatrixes, wherein in the subsequent stage of the recursive division routine each submatrix is a parent matrix; and combining the plurality of compressed submatrixes into a compressed blendshape output; and storing the compressed blendshape output on the hardware computing device for real-time rendering of the three dimensional virtual entity in a game application.

Although certain embodiments and examples are disclosed herein, inventive subject matter extends beyond the examples in the specifically disclosed embodiments to other alternative embodiments and/or uses, and to modifications and equivalents thereof.

BRIEF DESCRIPTION OF THE DRAWINGS

Throughout the drawings, reference numbers are re-used to indicate correspondence between referenced elements. The drawings are provided to illustrate embodiments of the subject matter described herein and not to limit the scope thereof.

DETAILED DESCRIPTION OF EMBODIMENTS

Overview

Figure 1:
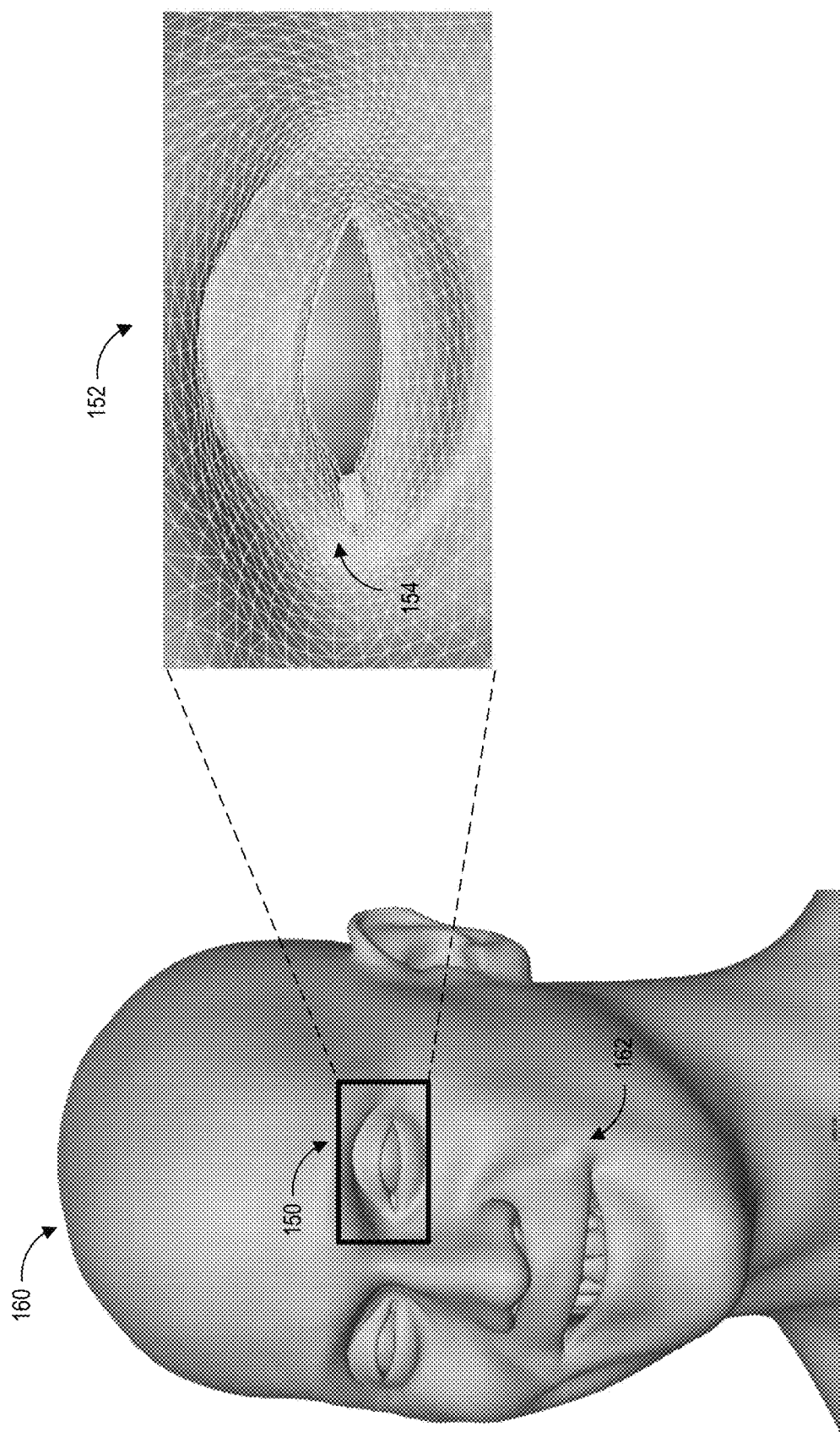
FIG. 1 illustrates an example embodiment of animating a virtual entity.

A 3D virtual entity can be represented by a skeletal model (described with reference to FIG. 10). The skeletal model can comprise a mesh which can include a set of vertices which defines the shape of a character. The skeletal model can be used in conjunction with the skin to provide graphics of the 3D virtual entity. The skin can control the appearance of the virtual entity while the skeletal model can animate a pose of the 3D virtual entity by deforming the mesh.

The blendshapes method can represent a pose of a virtual entity as a combination of a set of target shapes in the skeletal model. To animate a pose, the blendshapes method can modify a basic mesh associated with a neutral shape by transforming the vertices in the basic mesh with reference to vertices associated with a target shape. In some embodiments, the target shapes can be represented as displacements (for example offsets) of the vertices with respect to the basic mesh.

The blendshapes method may require a large number of target shapes to produce a high quality animation, particularly for a facial animation. In some situations, a blendshape matrix (used by the blendshape method) can include thousands of rows and hundreds of columns in order to take into account blendshapes and their associated displacements of vertices. For example, about 400-500 blendshapes may be used to provide a realistic animation of a human face. In some embodiments, a character may have over 900 target blendshapes in the final model. In some instances, more than 10,000 blendshapes can be created in the process of developing the final model.

As a result of the large size of blendshape matrixes, hundreds of megabytes of memory may be required to process a blendshape matrix during the rendering process. While the processing can involve matrix-vector multiplication, the size of the blendshape matrix may be too large to achieve real-time performance during the execution of a software application by a computing system (such as for example, by central processing units (CPUs) or graphics processing units (GPUs)). For example, real-time rendering requires 30-60 frames per second in a video game. However, in some situations, a blendshape face model incorporated with a body model and textures can only be rendered at one frame per second which is not sufficient for execution of the blendshape operations during real-time rendering.

To increase the performance and reduce the amount of computer memory used by the blendshape matrix, the blendshape matrix may be compressed using a compression technique, such as a principal component analysis (PCA) technique. However, the PCA technique generally works with a smaller number of shapes (for example around 50 shapes) than are used in a blendshape matrix, and can cause artifacts or rubber looking faces when applied to a blendshape matrix with a large number (for example several hundreds) of shapes. As a result, applying the PCA technique directly to the blendshape matrix can reduce the quality of the animation and cause unsatisfactory results.

Another compression technique can employ a hierarchically semi-separable (HSS) technique to compress a matrix by hierarchically replacing off-diagonal blocks with low rank approximations. However, the HSS technique may be inefficient in practice and may not provide sufficient performance for achieving real-time rendering of a virtual entity.

The present disclosure provides improved compression techniques that can increase the efficiencies in the compression of the blendshape matrix and can achieve real-time rendering of a virtual entity using the blendshape matrixes. The techniques and processes described herein can pre-process a blendshape matrix using a global clusterization process and a local clusterization process. The pre-processing can cause the blendshape matrix to be divided into multiple blocks. The techniques can further apply a matrix compression technique to each block of the blendshape matrix to generate a compression result. The matrix compression technique can include various steps including one or more of a matrix approximation step, an accuracy verification step, a recursive compression step. The compression result for each block may be combined to generate a compressed blendshape matrix for rendering a virtual entity. Detailed descriptions of the systems and processes are further provided below.

Examples of Animating a Virtual Entity

FIG. 1 illustrates an example embodiment of using blendshape matrixes when animating a virtual entity. The virtual entity may be a human, a humanoid (such as, for example, a science fiction alien), an animal, vegetation, an object (such as, for example, a vehicle), other animated characters, or any other type of virtual entity being rendered within a virtual environment.

In the example in FIG. 1, the virtual entity is an animated human entity 160. The animated human entity 160 can be represented by a skeletal model covered by a mesh. An enlarged left eye region 150 of the animated human entity 160 illustrates an embodiment of a portion 152 of a mesh. The mesh can cover the entire virtual entity. The mesh can include a number of vertices 154. The movements of the vertices' positions can cause movements of the corresponding regions of the animated human entity 160. For example, the positions of the vertices near the eye lid may move downward to animate a blinking pose.

The application can manipulate the appearance of the animated human by manipulating positions of the vertices on the skeletal model. The positions of vertices can be manipulated to provide a realistic simulation of a human's facial expressions. For the example, the positions of the vertices near mouth 162 can be manipulated to open the mouth up.

The positions of the vertices associated with various poses can be represented in a blendshape matrix described with reference to FIG. 2A. To render a pose, a computing device (such as the computing device 10 in FIG. 11) can access the blendshape matrix to calculate the positions of the vertices in the skeletal model. The computing device can accordingly calculate the movements associated with various parts of the animated human 160 based on the positions of the vertices in the skeletal model.

Examples of a Blendshape Matrix

Figure 2A:
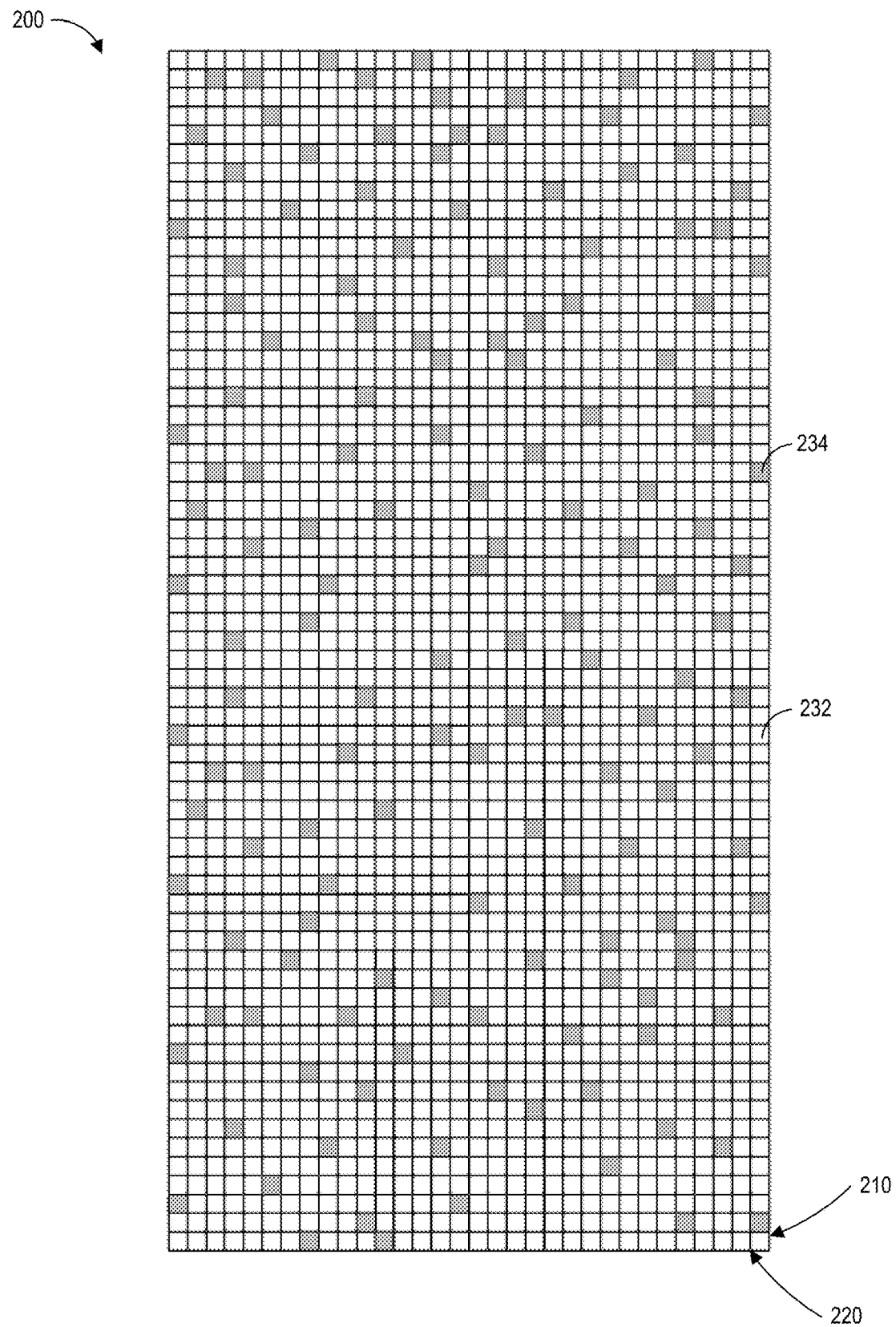
FIG. 2A schematically illustrates an example embodiment of a blendshape matrix.

FIG. 2A schematically illustrates an example embodiment of a blendshape matrix. The blendshape matrix 200 can describe the positions of blendshape model (also referred to as a basic mesh) of a virtual entity (such as for example, the animated human character in FIG. 1) for use within an application. In certain implementations, the blendshape matrix 200 can describe a portion of the virtual entity or the entire virtual entity. For example, the blendshape matrix 200 can be a face model of an animated human character. In some instances, two or more blendshape matrixes may describe the virtual entity.

The blendshape matrix 200 can include rows 210 and columns 220. In this example, the blendshape matrix 200 is illustrated to include 16 rows and 32 columns, even though in practice, the blendshape matrix 200 can include hundreds of rows and columns.

In some embodiments, the rows 210 can correspond to vertices within the blendshape and the columns 220 can represent positions of vertices in the blendshape model. Each column can be associated with a pre-defined pose or shape of the blendshape model (such as, for example, a smile or frown), with some columns representing in-between shapes or transitional shapes, which can be used to transition the shape of the blendshape model between a pre-defined pose or between a neutral pose and a pre-defined pose. In some embodiments, the positions of the vertices may be represented as displacements with reference to a neutral position, also referred to as a neutral pose of the blendshape model. In some embodiments, the positions of the vertices may be the positions in a 3D space (such as positions in a 3D coordinate system).

The blendshape matrix 200 can be used to calculate the amount of movement associated with a pose. During a rendering process, data in the blendshape matrix 200 may be accessed to calculate the movements of a virtual entity, such as movement of an animated character's muscles and the amount of deformations of the blendshape model. For example, when animating a frown pose of a character, displacements associated with the eye brows, eyes, cheeks, and so on, may be accessed to calculate their respective amounts of movements. Additional details with reference to character rendering and interactions in a video game are further described with reference to FIG. 10.

Matrix blocks with non-zero data are shown in grey (see example block 234) in the blendshape matrix 200 while white blocks represent neutral or zero data (see example block 232), where no movement is associated with element for the poses. In some embodiments, the blendshape matrix can have about 20-30% density. As illustrated in FIG. 2A, the blendshape matrix 200 is relatively sparse because a virtual entity may not need to manipulate all regions of the blendshape model to form each pose. For example, most of the displacements (with respect to the neutral pose) occur around the mouth region when an animated human smiles. There may be very little movement to no movement associated with the forehead for a smile pose of the character model.

Because the large size of the blendshape matrix 200 and its relatively sparse distribution of data, the blendshape matrix 200 can be compressed using the techniques described herein to reduce the amount of computing resources (for example, memory, CPU/GPU, or other hardware resources) spent on processing the data in the blendshape matrix 200 during real-time rendering.

Examples of Pre-Processing a Blendshape Matrix for Compression

The blendshape matrix 200 can be pre-processed for compression using a global clusterization process and a local clusterization process. The global clusterization process can operate on the blendshape matrix and divide the blendshape matrix into a plurality of blocks. The local clusterization process can operate on individual blocks of the blendshape matrix.

Examples of a Global Clusterization Process

Figure 2B:
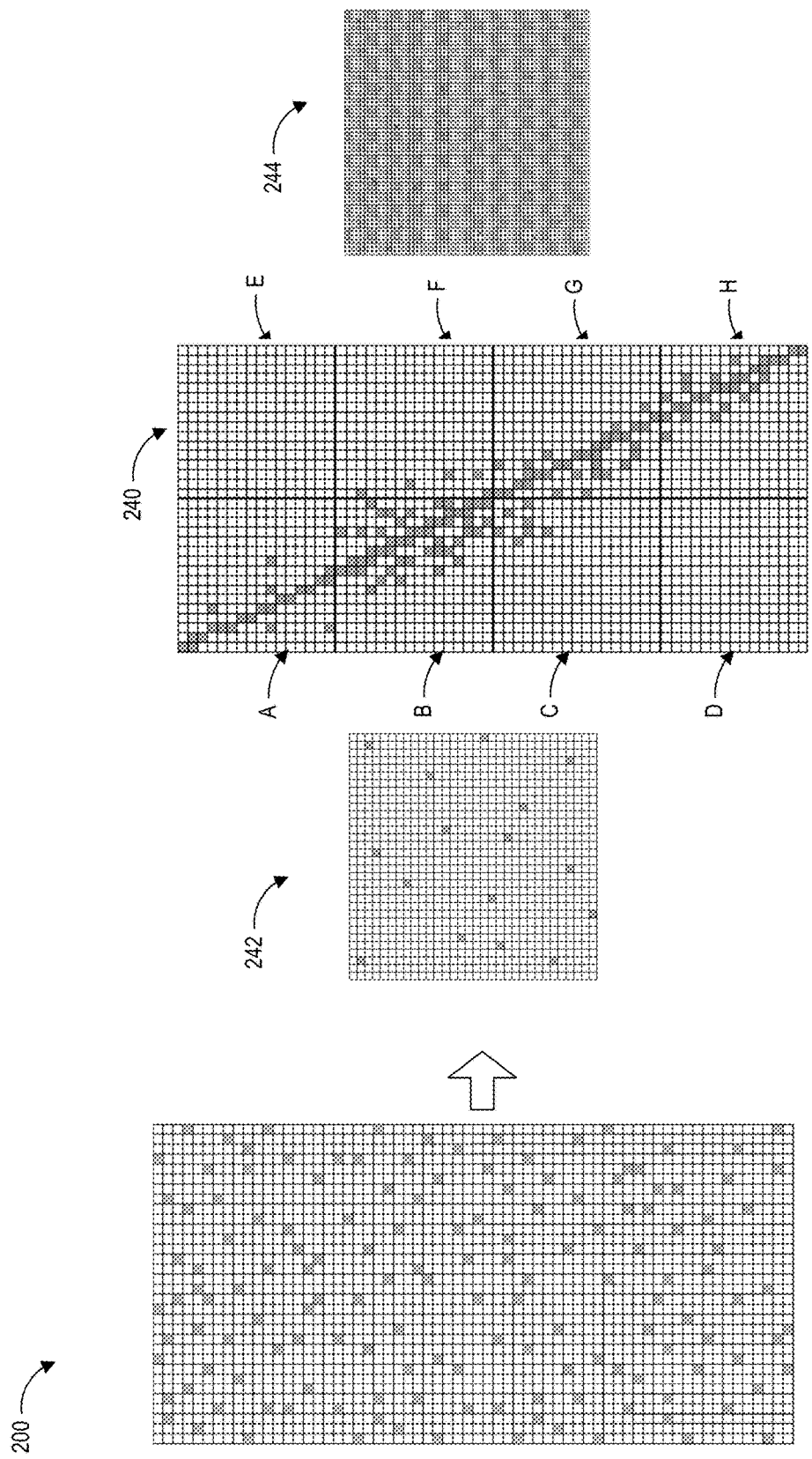
FIG. 2B schematically illustrates an embodiment of a blendshape matrix where a global clusterization process is applied.

FIG. 2B schematically illustrates an embodiment of a blendshape matrix 200 where a global clusterization process is applied. The global clusterization process can swap rows 210 and columns 220 to produce a globally-clustered matrix 240 where data are clustered around the diagonal of the matrix. During the global clusterization process, permutation matrixes 242 and 244 corresponding to the globally-clustered matrix 240 can also be produced. The permutation matrixes 242 and 244 can be used to restore the matrix 240 back to the matrix 200. As an example, assuming that the globally-clustered matrix 240 is an N×M matrix (where N represents the number of columns while M represents the number of rows), the permutation matrix 242 may be an N×N matrix while permutation matrix 244 may be an M×M matrix. With reference to FIG. 2B, the globally-clustered matrix 240 is a 32×64 matrix. Accordingly, the size of the permutation matrix 242 is 32×32 while the size of the permutation matrix 244 is 64×64.

In certain implementations, these permutation matrixes are stored as index arrays such that matrix operations do not need to be performed on the permutation matrixes during a rendering process. The permutation matrix 242 may be represented by an array of integer indices, where the array size is N. The permutation matrix 244 may be similarly represented by an array of integer indices, where the array size is M. As further described in FIG. 7, during the rendering, an input vector (such as, e.g., the weight vector w described in FIG. 7) can be remapped with the array that represents the permutation matrix 242. After performing the vector-matrix operation at runtime to extract resulting displacements, a remapping of the final displacement vector can be performed with the array that corresponds to the permutation matrix 244.

After the global clusterization process, the globally-clustered matrix 240 can further be divided into blocks, to which local clusterization process can be applied. In this example, the blendshape matrix 200 is divided into 8 blocks. Each block in the 8 blocks (A, B, C, D, E, F, G, H) in FIG. 2B includes 8 columns and 8 rows. Each block includes a portion of the globally-clustered matrix 240.

A variety of criteria may be used to divide the globally-clustered matrix 240 into blocks. Some example criteria may include the shape or size associated with the blocks, the globally-clustered matrix 240 (or the blendshape matrix 200), the number of blocks, and so on. For example, the number of columns and rows of the globally-clustered matrix 240 may be analyzed to divide it to a number of square blocks. Advantageously, in some embodiments, by dividing the globally-clustered matrix 240 into square blocks, the compression ratio of the blendshape matrix 200 may improve 2-4% because the local clusterization process (further described in FIG. 3) and matrix compression processes (such as the single value decomposition (SVD) matrix approximation technique (described in FIG. 4)) may operate better on substantially square blocks. In other embodiments, the blendshape matrix 200 may be divided in accordance with other shapes, such as a rectangle shape (for example, with more rows than columns in a single block).

As another example, the blendshape matrix 200 may be divided into 2 blocks (rather than 8 blocks shown in FIG. 2B). In this example, the blocks A, B, E, F may be part of the same block while the blocks C, D, G, H may be part of another block.

Examples of a Local Clusterization Process

Figure 3:
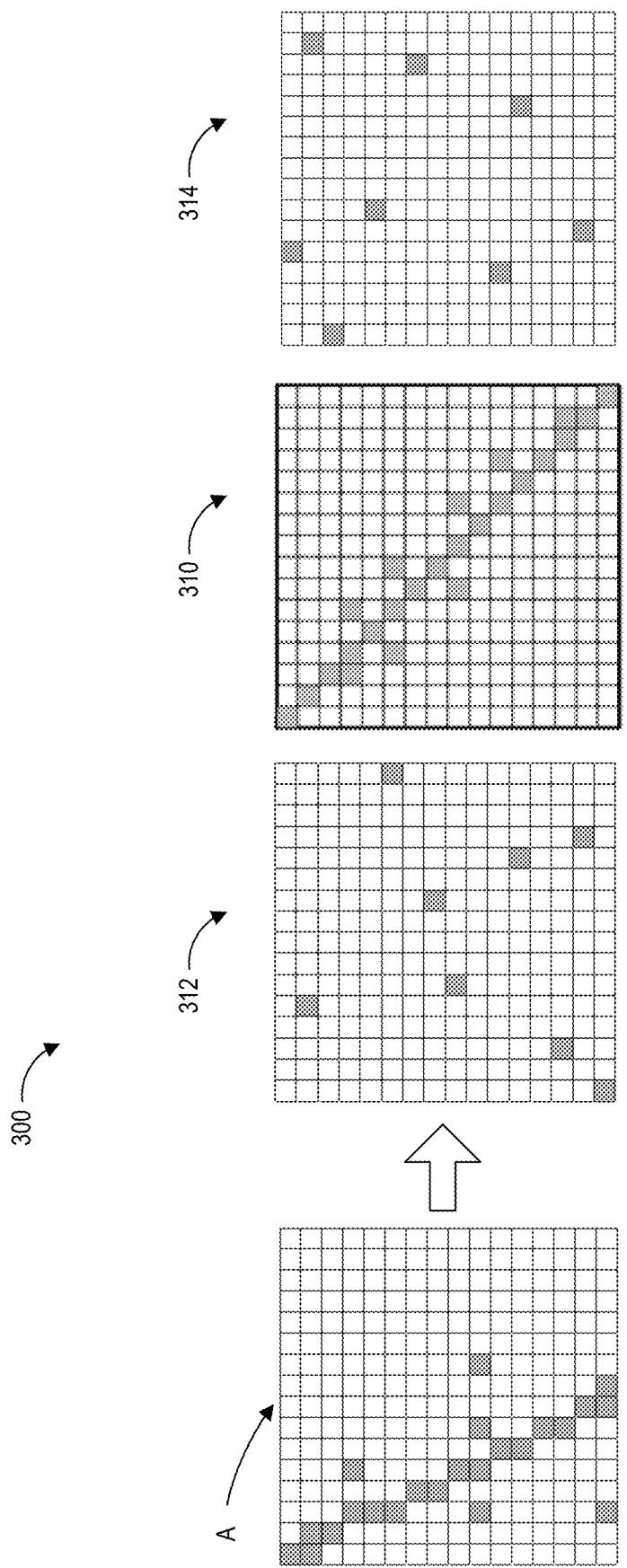
FIG. 3 illustrates an example of applying a local clusterization process on a portion of a blendshape matrix.

FIG. 3 schematically illustrates an example of applying a local clusterization process on a portion of a globally-clustered matrix. As described with reference to FIG. 2B, a global clusterization process can be applied to the blendshape matrix 200 which can result in a globally-clustered matrix 240. The globally clustered matrix 240 can be divided into a plurality of blocks. The local clusterization process can further be applied to each block of the plurality of blocks. The local clusterization process can include swapping rows and columns to produce a matrix (also referred to as a pre-processed matrix) where data has been rearranged to facilitate compression of the matrix, such as being generally clustered near the diagonal of the pre-processed matrix. The local clusterization process can be a similar process as the global clusterization process, except that the global clusterization process is applied to the whole blendshape matrix 200 while the local clusterization is applied to blocks of the globally clustered matrix 240 to improve compression locally.

As an example, block A from FIG. 2B can be rearranged into the pre-processed matrix 310, and matrixes 312 and 314. The matrixes 312 and 314 are permutation matrixes which can track the changes of the rows and columns of block A when generating the pre-processed matrix 310. Accordingly, the block A may be restored using matrix multiplication from the pre-processed matrix 310 and matrixes 312 and 314.

The pre-processed matrix 310 shows a denser cluster of data (illustrated in grey blocks) around its diagonal than block A. The size of the matrixes 312 and 314 can be fairly small compared to the pre-processed matrix 310. Similar to the descriptions with reference to permutation matrixes 242 and 244, the dimensions of the matrixes 312 and 314 can correspond to the dimensions of the pre-processed matrix 310. For example, if the pre-processed matrix 310 has dimensions NxM, then the matrix 312 is of dimensions MxM or represented by an array of integer indexes the size of M, and 314 the size of NxN or an array of size N, where N is number of rows and M is number of columns. As shown in in FIG. 3, the pre-processed matrix 310 is a 16×16 matrix and the matrixes 312 and 314 are both 16×16 matrixes.

Because the local clusterization process can be applied to each block of the blocks of the globally-clustered matrix 240 resulted from the global clusterization process, the blendshape matrix 200 can result in 8 pre-processed matrixes 310 (corresponding to the blocks A, B, C, D, E, F, G, H) and their respective permutation matrixes 312 and 314. Each of these 8 pre-processed matrixes (such as the pre-processed matrix 310) may be compressed using the matrix compression techniques described herein.

Although the example local clusterization processes in FIG. 3 are described with reference to processing a portion of the globally-clustered matrix 240 after the global clusterization process, in some embodiments (such as the example embodiment in FIG. 6), the local clusterization process may not be required. For example, only global clusterization may be applied to the blendshape matrix before applying the matrix compression techniques described below. This implementation may be useful if the blendshape matrix is substantially square in shape.

Examples of Matrix Compression Techniques

The pre-processed matrix 310 can be compressed to further reduce data size. The compression of the pre-processed matrix 310 can include various processes such as comprise matrix approximation processes, accuracy verification processes, and recursive compression processes.

Figure 4:
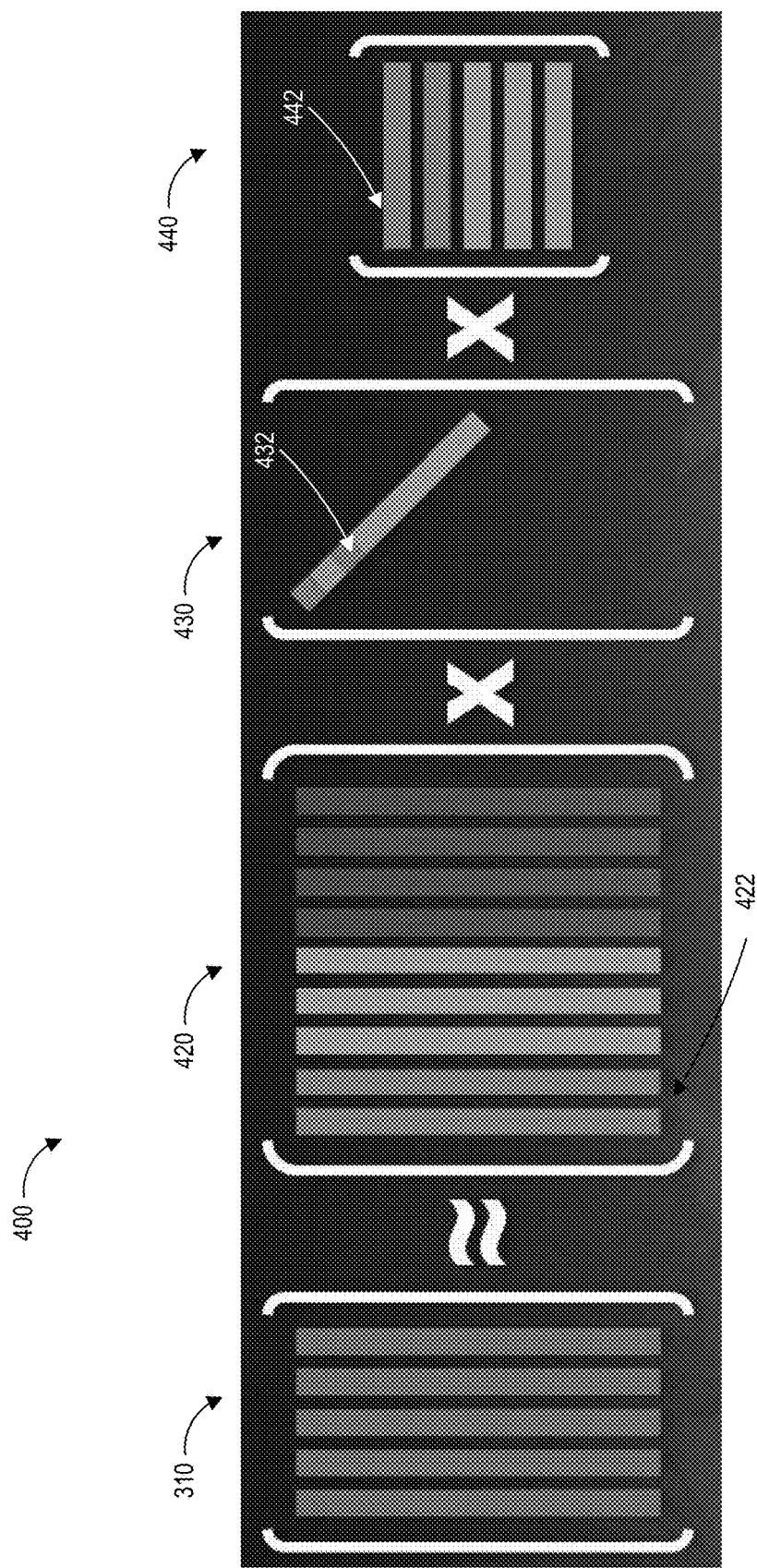
FIG. 4 illustrates an example embodiment of a matrix approximation technique, such as for example, a singular value decomposition (SVD) technique.

FIG. 4 illustrates an example embodiment of a matrix approximation technique, such as for example, a singular value decomposition (SVD) technique. The matrix approximation technique 400 can decompose the pre-processed matrix 310 into three principal components including matrixes 420, 430, and 440 using a matrix approximation technique such as the SVD. The matrix approximation technique 400 can further select a few values from the each of matrixes 420, 430, and 440.

In the embodiment illustrated in FIG. 4, the approximation of the pre-processed matrix 310 can be based on the first two columns 422 of matrix 420; the diagonal values 432 of the matrix 430, and the first two rows 442 of the matrix 440. The columns 422, diagonal values 432, and rows 442 can be saved as an approximation of the pre-processed matrix 310. In certain implementations, the diagonal values 432 can be pre-multiplied with the columns 422 or rows 442. As a result, the approximation of the pre-processed matrix 310 can include columns 422 (or rows 442) and the result from the pre-multiplication between the rows 442 and the diagonal values 432 (or between the columns 422 and the diagonal values 432).

The approximation of the pre-processed matrix 310 may be analyzed with reference to an accuracy threshold to verify the accuracy of the approximated matrix. The accuracy threshold may be calculated based on one or more differences between the pre-processed matrix 310 and the approximated matrix. The accuracy threshold may be based on one or more pre-defined values relative to the values of the pre-processed matrix. In some embodiments, the accuracy threshold may be a static difference between the pre-processed matrix and the approximated matrix. For example, the accuracy threshold may require that the values of the approximated matrix are within 0.5 of the values within the pre-processed matrix. In some embodiments, the accuracy threshold may be based on individual values within the pre-processed matrix, such as a percentage difference. For example, the accuracy threshold may require that the values of the approximated matrix are within 25% of the values within the pre-processed matrix. The percentage difference may be any desired percentage.

As an example, assuming that the pre-processed matrix 310 is approximated by the columns 422, diagonal values 432, and rows 442, values in the columns 422, diagonal values 432, and values in the rows 442 can be multiplied using matrix multiplication techniques to generate an approximated matrix. The values in the approximated matrix may be compared with the pre-processed matrix 310. The discrepancy between the approximated matrix and the pre-processed matrix 310 may be determined based on the pre-processed matrix.

The approximated matrix may be unsatisfactory if the discrepancy is greater than a defined accuracy threshold value, because for example, the error rate is greater than a threshold rate or because the differences between the approximated matrix and the pre-processed matrix 310 are greater than the accuracy threshold. The matrix approximation technique may be performed again with its parameters adjusted. For example, rather than selecting the first two rows from the matrix 440, the first two columns from the matrix 420, and the first and the third values from the matrix 430, the pre-processed matrix 310 may be approximated using the first 3 rows in the matrix 440, the first three columns from the matrix 420, and the first three values in the matrix 430.

The compression of the pre-processed matrix 310 can repeat the accuracy verification step and additional matrix approximation step until a satisfactory accuracy is achieved. Although in this example, the threshold value is based on a level of accuracy, in certain implementations, the threshold value could also be based on how inaccurately the approximated matrix represents the pre-processed matrix 310.

Figure 5:
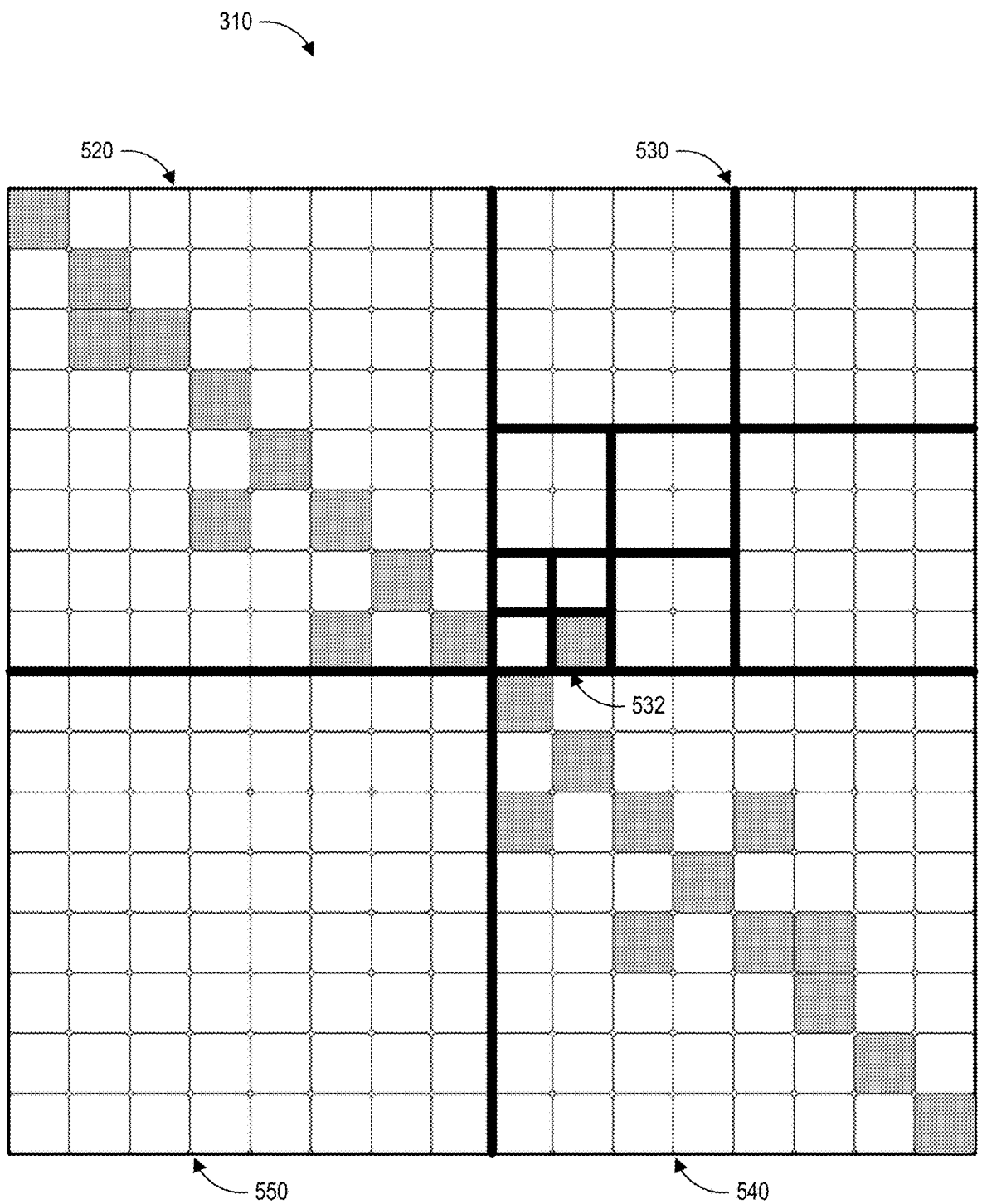
FIG. 5 illustrates an example embodiment of a compression of a matrix.

To improve the compression of the pre-processed matrix 310, a recursive or iterative compression process may also be performed. FIG. 5 illustrates an example embodiment of a compression of a matrix. The example recursive compression process illustrated in FIG. 5 comprises a hierarchical decomposition of the pre-processed matrix 310. The hierarchical decomposition can comprise dividing the pre-processed matrix 310 into smaller blocks and testing whether the compression ratio improves with the smaller blocks.

With reference to FIG. 5, the hierarchical decomposition can divide the pre-processed matrix 310 into sub-matrixes such as sub-matrixes 520, 530, 540, and 550. The division may follow one or more of the criteria described with reference to the global clusterization process in FIG. 2B. This recursive compression process can apply the matrix approximation technique described with reference to FIG. 4 and the accuracy verification process to further compress the sub-matrixes 520, 530, 540, and 550.

The compression process can calculate a compression ratio associated with the pre-processed matrix 310 based on the approximated matrix generated in FIG. 4. The compression process can calculate another compression ratio associated with the compressed sub-matrixes 520, 530, 540, and 550. The two compression ratios may be compared to determine whether dividing the pre-processed matrix 310 into the sub-matrixes further improves the compression ratio. If the compression ratio is not improved, then the result of the compression associated with the pre-processed matrix 310 will be the matrix approximation for the whole pre-processed matrix. If the compression ratio is improved, each sub-matrix 520, 530, 540, or 550 may further be recursively divided and compressed in accordance with the matrix compression techniques described with reference to FIGS. 4 and 5 until the matrixes cannot be further divided or the compression ratio cannot be further improved.

As an example, assuming the recursive division and compression has reached the block 532. The block 532 can further be divided into 4 square matrixes where 3 of the square matrixes are empty while the remaining one square matrix has non-zero data (illustrated in gray). The recursive compression step can further compress the 4 square matrixes and calculate a compression ratio associated with the 4 squares. In this example, the compression ratio associated with the 4 square matrixes may be 75% (since only 1 square matrix has data). However, before the subdivision, the compression ratio associated with the block 532 may be 0% because it may need all 4 square matrixes to represent the whole block 532. Because subdivisions can improve the compression of the block 532 and the square matrixes in the block 532 cannot be further divided, the recursive compression step can output the compressions for 4 individual square matrixes as the compression result for the block 532 rather than the compression for the block 532 (as the whole) as the compression result.

Although the examples in FIGS. 4 and 5 describe the compression techniques as a top-down recursive process, where the compressions start with a pre-processed matrix 310 and recursively move to smaller blocks, in some embodiments, the compression techniques can also be implemented as a bottom-up process. For example, the pre-processed matrix 310 can be first be divided into small subblocks and compressed. The compression ratio calculated based on the compressions of several small blocks may be compared with the compression ratio of the compression of these small blocks combined (without division). The compression can continue with larger blocks until it reaches the pre-processed matrix 310. Furthermore, although the example in FIG. 5 is illustrated with reference to a quad-tree subdivision where each sub-matrix is divided into four sub-matrixes recursively, other sub-division schemes could also be applied. One example sub-division scheme may be a binary tree, where each sub-matrix is split into two sub-matrixes horizontally and vertically. The compression ratios of such division can then be compared. In some situations, the binary tree sub-division scheme can produce slightly better compression results (than the quad-tree sub-division) but the binary tree compression process may take much longer.

The compression results for each region (including the blocks divided due to pre-processing or matrix compression) can be assembled to create a compressed blendshape matrix. For example, the compression result for the pre-processed matrix 310 will become the compression result for the block A of the blendshape matrix 200. The compression result for each region may include the values associated with matrix approximations determined in the matrix approximation step, the accuracy verification step, and the recursive compression step.

Figure 6:
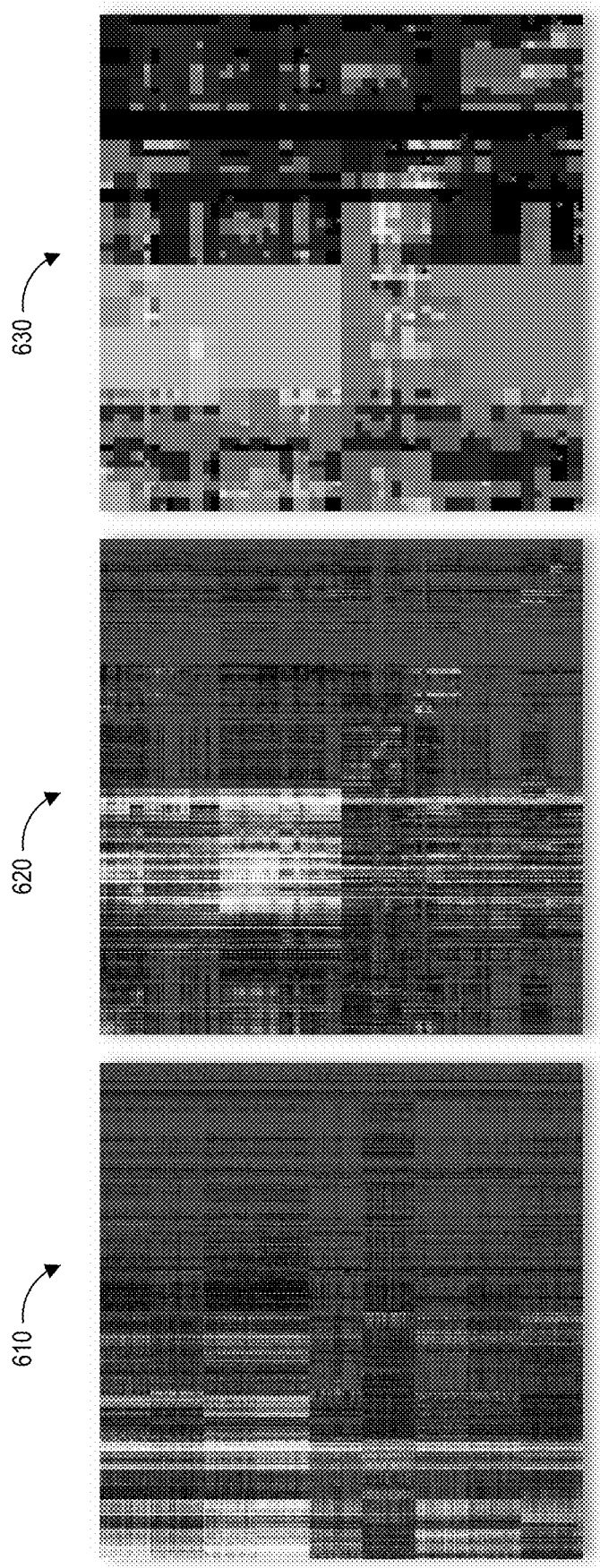
FIG. 6 illustrates example heatmaps of data distributions associated with compressing a blendshape matrix.

FIG. 6 illustrates example embodiments of heatmaps of data distributions associated with compressing a blendshape matrix. The white color in the heatmaps 610 and 620 is associated with non-zero values while the darker color including red means that the values are 0.

Heatmap 610 illustrates an example data distribution of a portion of a globally-clustered matrix after a global clusterization process is applied to a blendshape matrix. The portion of the globally-clustered matrix may be the block A shown in FIG. 2B. As shown in the heatmap 610, the matrix after the global clusterization process is still quite sparse.

As described with reference to FIGS. 2B and 3, after the global clusterization process is applied to the blendshape matrix, a local clusterization process may be applied. The local clusterization process is similar to global clusterization except it applies to blocks within the globally-clustered matrix (such as for example, the block A). The result of the local clusterization is illustrated in the heatmap 620, where square clusters are formed. In this example, after the local clusterization process, the data appears to be densely located around the diagonal and near the top left center.

Heatmap 630 illustrates an example data distribution after the globally-clustered matrix has been compressed with the compression techniques described herein (such as for example the compression techniques described with reference FIG. 5). In this example, lighter colors represent a greater amount of retained data (and hence a lower compression ratio) while darker colors represent a greater amount of compression (and hence a higher compression ratio). In this case the darker color represents higher compression ratio because there are more zeroes the region, hence less data is needed to represent the region. Lighter colors (such as for example yellow or green) represents lower compression ratio because there are more values needed to represent data in that region. In other words, the compressions described herein are associated with representing sparse or zero data in a more efficient manner (rather than compressing the data itself).

Comparing the heatmap 630 with the heatmap 620, a lower compression ratio occurs around the top left center in the heatmap 630 which coincides with the regions where the data are densely located in the heatmap 620.

Examples of Rendering a Virtual Entity Based on a Compressed Blendshape Matrix

During a rendering process, the compressed blendshape matrix can be used to calculate the positions of vertices in a mesh for rendering animations of a character. The positions of the vertices may be calculated using matrix vector operations in accordance with the formula (1) shown below:

$$o=n+Bw \quad (1)$$

where o is a vector containing the resulting vertex positions of the target shapes; w is a vector storing the blending weight of the target shapes; and n is a neutral shape vector. B can represent a blendshape matrix whose columns can represent displacements with respect to the neutral pose and whose rows can represent target shapes.

In some instances where the blendshape matrix is uncompressed and when the weight vector w is sparse, a portion of the blendshape matrix may be identified to be relevant for rendering a certain pose. For example, when rendering the mouth region of a character, the portion of the blendshape matrix describing the mouth region (rather than the whole face) may be accessed. This process is sometimes referred to as sparse activiation.

However, because a final pose may be a combination of many blendshapes, the weight vector w may have a lot of non-zero weights. In addition, due to the clusterization process (for example the global clusterization and the local clusterization), different parts of the mesh and shapes can be scrambled together, which creates difficulties for fast extraction of a single shape. As a result, when the weight vector w is multiplied with the compressed blendshape matrix B, the matrix vector multiplication may be performed over the whole compressed blendshape matrix B (rather than only a portion of the matrix B). For example, the matrix vector multiplication may be performed over the sub-matrixes in the compressed blendshape matrixes to obtain the final pose.

Figure 7:
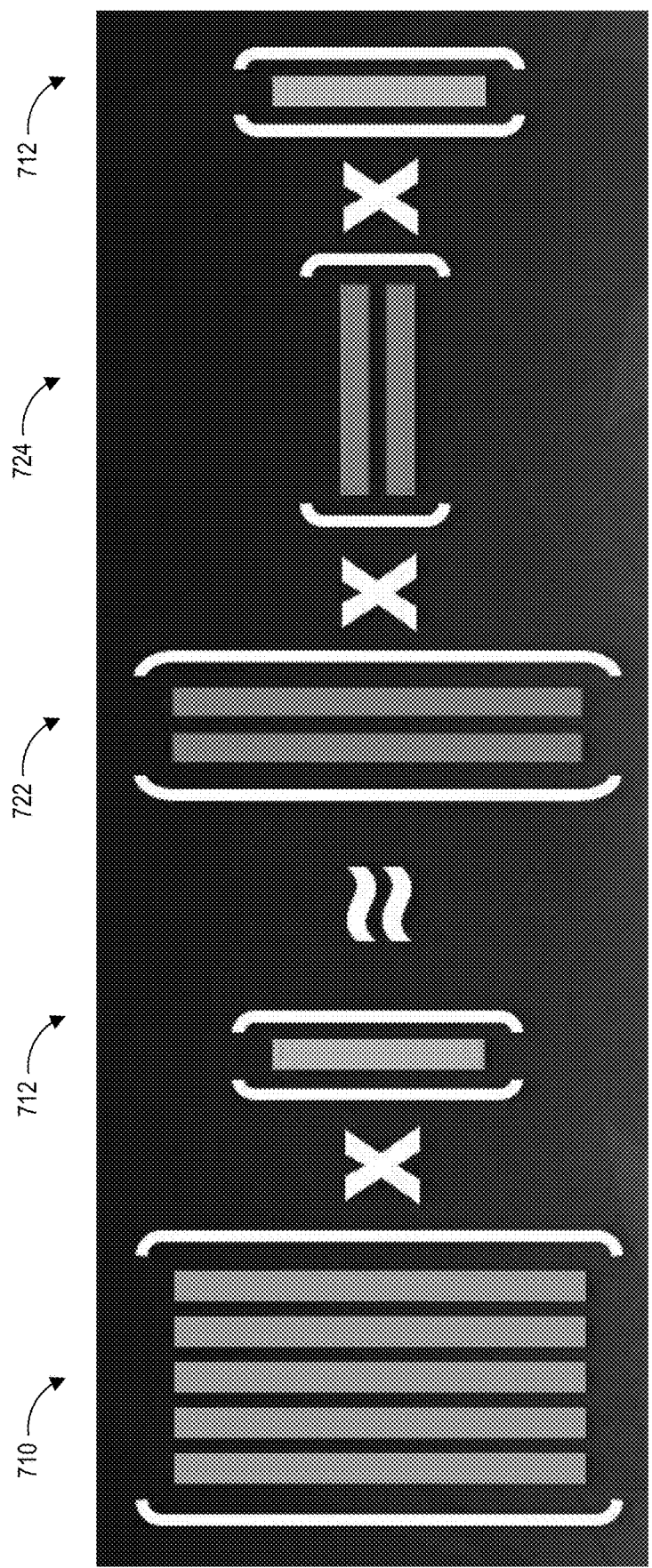
FIG. 7 illustrates an example of a matrix vector operation using a compressed blendshape sub-matrix.

FIG. 7 illustrates an example of a matrix vector operation using a compressed blendshape sub-matrix. The sub-matrix can correspond to an approximation (represented by matrixes 722 and 724) associated with the sub-matrix 532 (shown in FIG. 5). In this example, the sub-matrix 710 may multiply a weight vector 712 (which may include a portion of the variable w in the formula (1)) to calculate the deformations (or positions) of the vertices.

To perform the matrix vector multiplication of the compressed blendshape matrix, a portion of the weight vector w may first be multiplied with the permutation matrixes (such as, for example, the permutation matrix 312) for respective blocks A, B, C . . . H of the compressed blendshape matrix, where the permutation matrix for each block may be different. Then the matrix vector operation described in FIG. 7 can be applied to the sub-matrixes of each block. After the matrix vector operation is applied to the submatrixes of each block, an inverse permutation can be performed using the other permutation matrixes (such as for example, the permutation matrix 314) for respective blocks. As described with reference to FIG. 3, the values of the other permutation matrixes are specific to the respective blocks, since the rows and columns in each block may be re-arranged differently to produce the respective diagonal matrixes.

As an example, in FIG. 5, the weight vector can first be multiplied with the permutation matrix 312 (which corresponds to the matrix 310). Then the matrix vector operation in FIG. 7 is applied to sub-matrixes 520, 550, 540, and 532. The matrix vector operation in FIG. 7 is applied to sub-matrix 532 (rather than the matrix 530) because the 532 is the only block having non-zero data in the matrix 530. After the matrix vector operation, the permutation matrix 314 can be applied to the result of the operation for performing the inverse permutation.

Advantageously, in this example, the compressed blendshape matrix does not need to be decompressed. Rather the approximated values stored in the compressed blendshape matrix can be accessed directly. According, the time and computing resources spent can be significantly decreased due to the reduced amount of matrix-vector multiplication and due to the reduced amount of storage and access costs associated with the compressed blendshape matrix, as compared to an uncompressed blendshape matrix.

As an example, assuming the identified portion 710 is an m×n matrix, the cost needed to perform matrix-vector product operation is m×n. However, if the compressed matrix is used for matrix-vector product operation, the cost would be (m+n)×k where k is the rank of the matrix and is a much smaller value. Assuming m=n=50, then the cost for an uncompressed matrix-vector product operation would be 50×50=2500 while the cost for a compressed matrix-vector product operation would be (50+50)×5=500.

Example Processes for Outputting a Compressed Blendshape Matrix

Figure 8A:
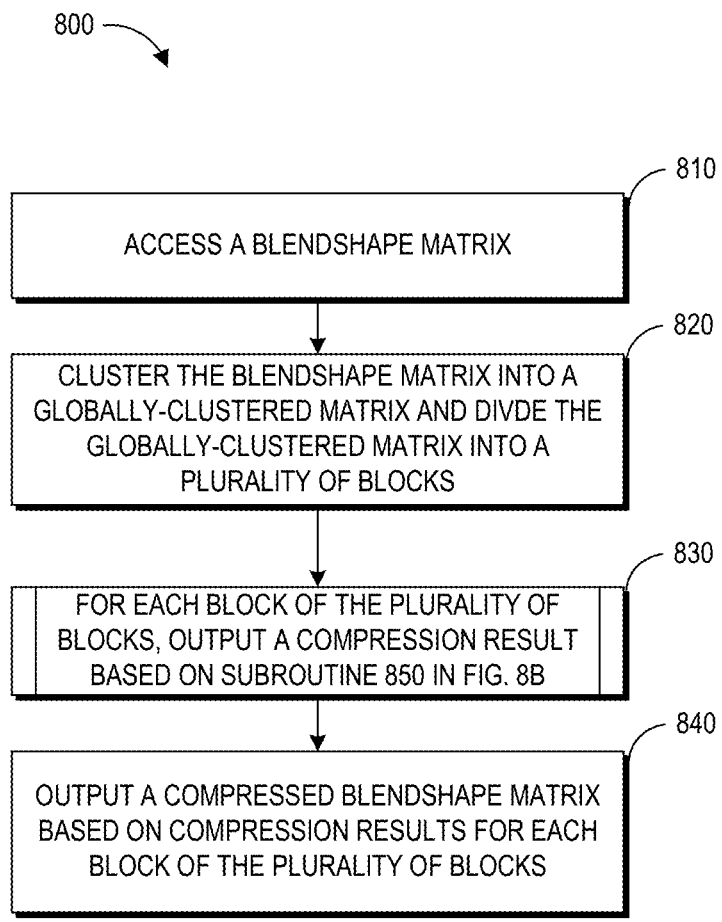
FIGS. 8A, 8B, and 8C illustrate an example process for outputting a compressed blendshape matrix.
Figure 8B:
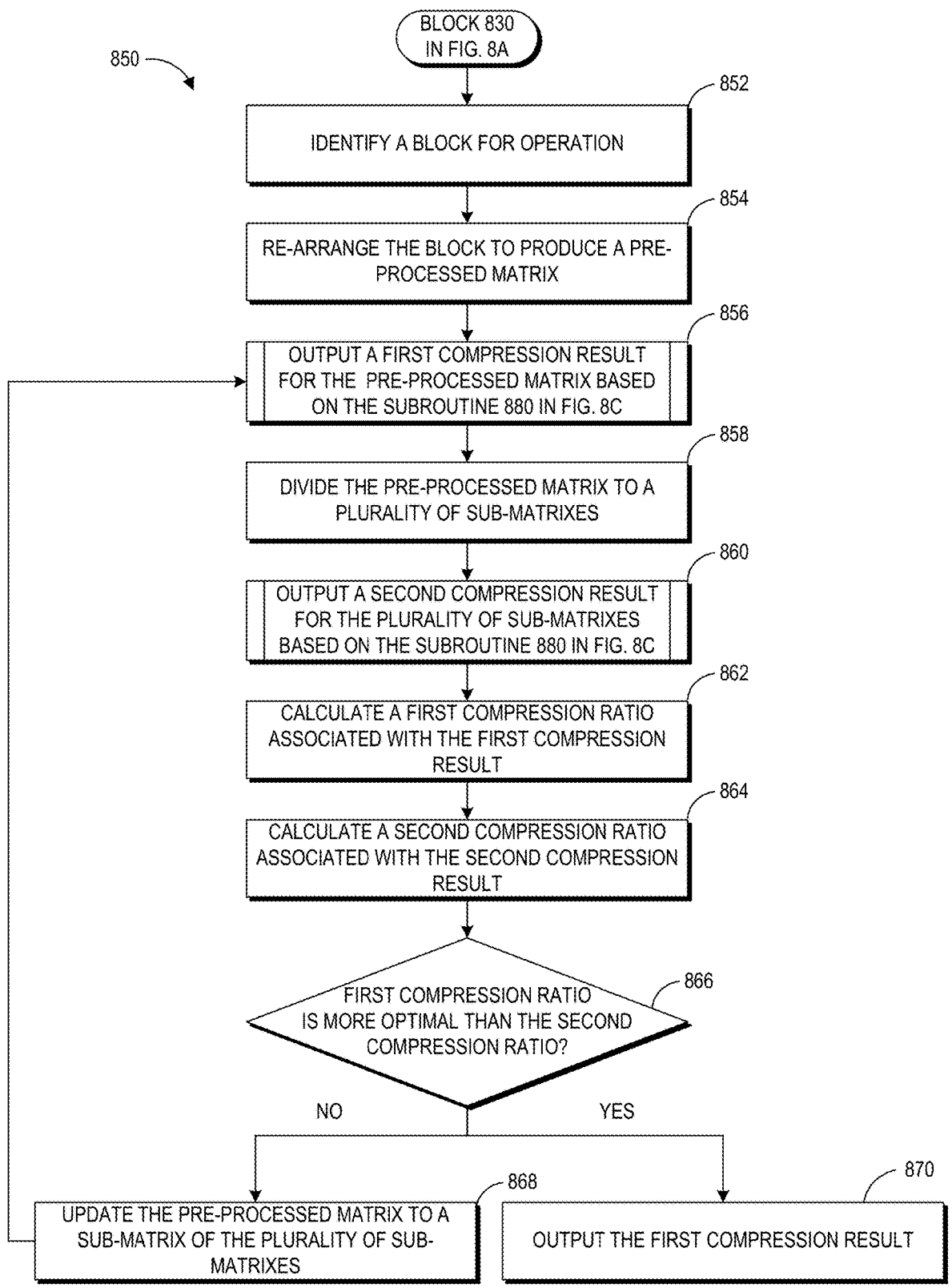
Figure 8C:
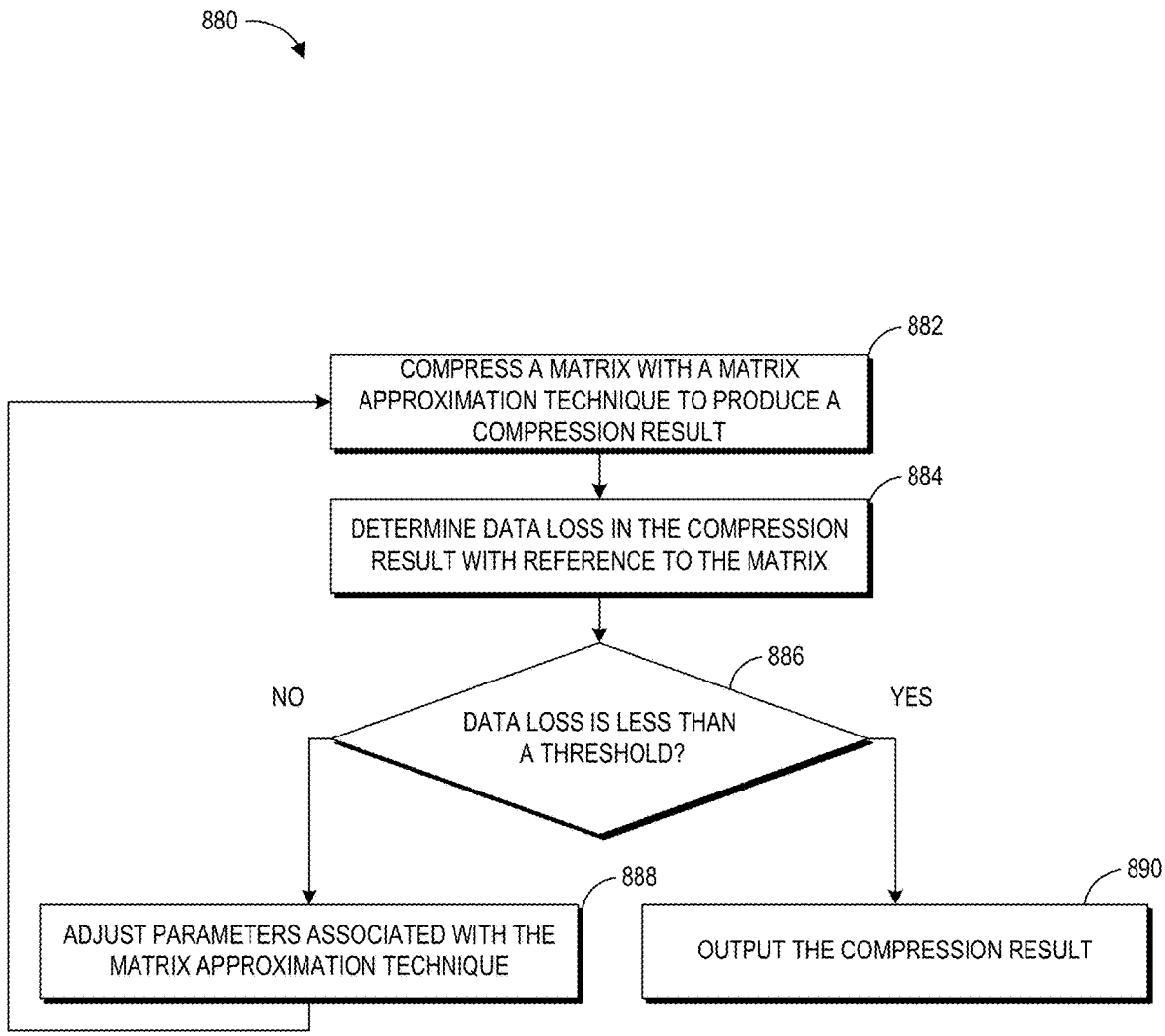

FIGS. 8A, 8B, and 8C illustrate an example process for outputting a compressed blendshape matrix. The example process 800 can be implemented by the computing device 10 in FIG. 11. In some embodiments, the computing device 10 is associated with a game developer.

At block 810, the computing device 10 can access a blendshape matrix. The blendshape matrix can include a number of rows associated with blendshapes and a number of columns associated with displacements of the blendshapes for various poses. In some embodiments, each column can represent a different pose.

At block 820, the computing device 10 can cluster the blendshape matrix into a globally-clustered matrix and divide the globally clustered matrix into a plurality of blocks. Block 820 may be part of the global clusterization process described with reference to FIG. 2B. For example, a clusterization process may be performed on the blendshape matrix as a whole to produce a globally-clustered matrix. The globally-clustered matrix may be divided into several blocks with substantially similar sizes and substantially square shapes.

For each block of the plurality of blocks, subroutine 830 is performed. In the subroutine 830, each block can further be re-arranged and compressed in accordance with the subroutine 850 in FIG. 8B. The compression result may be outputted at the end of the subroutine 850. The compression result can include approximated matrixes associated with each block.

At block 840, the computing device 10 can output one or more compressed blendshape matrixes based on compression results for each block of the plurality of blocks. For example, the computing device 10 can combine the compression results for each block together based on the locations of the blocks in the blendshape matrix. With reference to FIG. 2B, the compression result for block A may occupy the same location as the block A in the compressed blendshape matrix while the compression result for block B may occupy the same location as the block B in the compressed blendshape matrix (which may be below the location associated with the compression result for block A).

Example Compression Subroutines

In subroutine 850 of FIG. 8B, at block 852, the computing device 10 can identify a block for operation. The block can be one of the blocks in the plurality of blocks resulted from the process block 820 in FIG. 8A. At block 854, the identified block can be rearranged to produce a pre-processed matrix. The block 854 can be part of the local clusterization process described with reference to FIG. 3. For example, the local clusterization process can re-arrange the columns and rows in the block identified for operation to produce a pre-processed matrix where data with data non-zero values are generally clustered within the pre-processed matrix, such as around the diagonal of the matrix.

At block 856, the pre-processed matrix can be compressed in accordance with the subroutine 880 in FIG. 8C. The subroutine 880 can output a first compression result associated with the pre-processed matrix. For example, the first compression result can include an approximated matrix associated with the pre-processed matrix.

At block 858, the pre-processed matrix can further be divided into a plurality of sub-matrixes. The process in the block 858 may be part of the recursive compression process in the matrix compression described with reference to FIG. 5. At block 860, the subroutine 880 can output a second compression result for the plurality of sub-matrixes. The second compression result can include approximated matrixes with respective sub-matrixes of the plurality of sub-matrixes. For example, assuming that the pre-processed matrix is divided into four sub-matrixes, the second compression result can include four approximated matrixes each corresponding to one submatrix.

At block 862, a first compression ratio associated with the first compression result is calculated. For example, the first compression ratio may be calculated by counting the number of rows and columns of the pre-processed matrix and the number of rows and columns of the approximated matrix. As an illustrative example, if the pre-processed matrix is a 16 by 16 matrix and the approximated matrix is a 4 by 4 matrix, then the compression ratio may be 75%.

At block 864, a second compression ratio associated with the second compression result is calculated. The second compression ratio is calculated based on the approximations for each of the plurality of sub-matrixes. For example, the second compression result may include a total of 8 rows and 8 columns. This number can be compared with the number of rows and columns of the pre-processed matrix to calculate the second compression ratio. As a result, the second compression ratio may be 50% (from 16×6 to 8×8).

At block 866, the computing device 10 determines whether the first compression ratio is more optimal than the second compression ratio. With reference to the same example above, 75% compression ratio is more optimal than the 50% compression ratio since the size of the matrix is smaller with a 75% compression ratio. As a result, at block 870, the first compression result is outputted as the compression result for the pre-processed matrix.

On the other hand, if the first compression ratio is more optimal than the second compression (for example where the second compression ratio becomes 80%), the plurality of sub-matrixes may further be sub-divided and apply the same process described in the process blocks 856 through 866. As an example implementation in a software executing the process 800, the value of the variable that was initially set to the pre-processed matrix may be updated from the pre-processed matrix to a sub-matrix of the plurality of sub-matrixes for further processing. The process 850 may repeat the blocks 856 through 866 as a recursive process until a sub-matrix (or the pre-processed matrix) can no longer be subdivided or until compression results associated with all regions in the pre-processed matrix have been outputted.

Example Subroutines for Matrix Approximation and Accuracy Verification

The subroutine 880 in FIG. 8C illustrates an example matrix compression technique. The subroutine 880 can correspond to the matrix approximation step and the accuracy verification step described with reference to FIG. 4. As described with reference to FIG. 8B, the subroutine can be applied to a pre-processed matrix or any subdivisions of the pre-processed matrix.

At block 882, the computing device 10 can compress a matrix with a matrix approximation technique to produce a compression result. The compression result may include one or more approximated matrixes as a representation of the matrix. The matrix approximation technique may be the SVD technique (described in FIG. 4), lower upper (LU) decomposition, QR decomposition, Eigen decomposition, or any other matrix decomposition technique that achieves an approximation of a low-rank matrix and allows for approximated vector-matrix multiplication operation.

At block 884, the computing device 10 can determine data loss in the compression result with reference to the matrix. As described with reference to the accuracy verification step in the matrix compression, the data loss (or inaccuracies introduced due to the matrix approximation) may be compared to a accuracy threshold condition (as shown in block 886). If the data loss is less than the threshold, at block 890, the subroutine 880 can output the compression result produced in the block 882. If the data loss is greater than the threshold, the computing device can adjust parameters associated with the matrix approximation technique at the block 888. For example, the computing device 10 may select more rows and columns for matrix approximate. Even though selecting more rows and columns reduces the compression ratio, the accuracy of the compression may be improved and thereby may reduce the likelihood of introducing artifacts due to the compression. The subroutine 880 can repeat the process blocks 882 through 888 until the data loss is less than the threshold.

Figure 9:
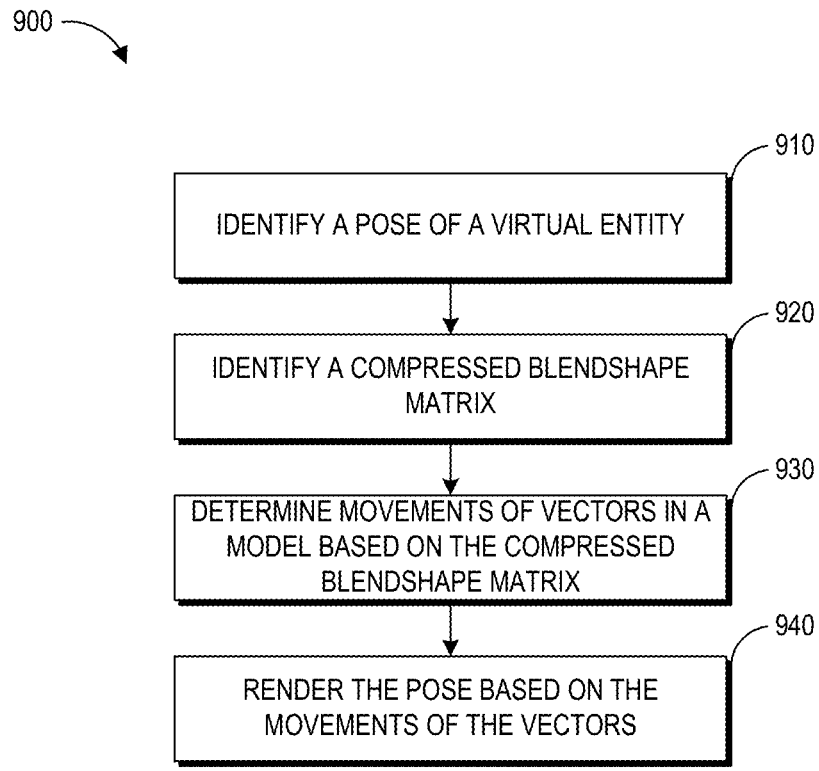
FIG. 9 illustrates an example process of rendering a virtual entity based on a compressed blendshape matrix.

Example Processes of Rendering of a Virtual Entity Based on a Compressed Blendshape Matrix FIG. 9 illustrates an example process of rendering a virtual entity based on a compressed blendshape matrix. The example process 900 may be implemented on a game player's computing system, such as, for example, the game system 100 in FIG. 10. As example, the example process 900 can be performed by the skinning and rendering engine 114 and the object combiner 116 (shown in FIG. 10) alone or in combination. The example process 900 may be executed by the CPU or GPU of the game player's computing system, alone or in combination. In some embodiments, the example process 900 may be performed in real-time as the game player's computing system is executing a game application.

At block 910, the computing system can identify a pose of a virtual entity. The pose may be identified in response to a game state, a game player's input, in combination or the like. The pose may be animated via movements associated with a plurality of blendshapes in a model (such as for example, a face model). The model may include a variety of vertices associated with a mesh. The vertices may be moved in accordance with vectors. The combined effects of the vertices' movements may also be controlled based on a weight vector (as shown in the formula (1)). For example, one blendshape's movement may account for a heavier effect than another blendshape's movement because the weights assigned to these two vectors are different. Therefore, the computing system can calculate weight vector w which will be used to achieve the pose.

At block 920, a compressed blendshape matrix associated with the virtual entity is identified. The compressed blendshape matrix can be generated based on the process 800 described with reference to FIGS. 8A-8C. The compressed blendshape matrix can include approximations of an uncompressed blendshape matrix. The block 920 can retrieve the compressed blendshape matrix (for example from a computer storage). The compressed blendshape matrix can be multiplied by the weight vector at block 930.

At block 930, the movements of vertices in a model may be determined based on the compressed blendshape matrix. In some embodiments, the movements of the vertices may be associated with the movements of the vertices in a mesh. Advantageously, in certain implementations, rather than decompress the compressed blendshape matrix, the movements of the vertices can be calculated based on the approximated values in the compressed blendshape matrix. For example, the movements of the vertices can be calculated using the formula (1) where the blendshape matrix B is substituted by the compressed blendshape matrix which is much smaller in size.

As an example of calculating the movements of the vertices using the compressed blendshape matrix, a portion of the weight vector w may first be permutated by multiplying with the permutation matrixes (such as, for example, the permutation matrix 312) for respective blocks A, B, C ... H of the compressed blendshape matrix. For each block, a matrix-vector multiplication is performed on each of the non-zero sub-matrix (such as for example, sub-matrixes 520, 532, or 540 in FIG. 5) in a pre-processed matrix (for example, the pre-processed matrix 310 in FIG. 3) associated with that block (for example block A). With reference to FIG. 7, the sub-matrix 710 may be a non-zero sub-matrix while the weight vector 712 is a portion of the weight vector that corresponds to the non-zero sub-matrix. The result of matrix multiplication for each non-zero sub-matrix of the block can be assembled into a resulting displacement vector for the block.

Once the resulting displacement vector has been obtained, an inverse permutation can be performed using the other permutation matrixes (such as for example, the permutation matrix 314). The inverse permutation on the resulting displacement vector can place the values in the resulting displacement vector into correct locations in a global result. The global result can include results (after the inverse permutation) for each block and can describe displacements associated with the movements of vertices.

At block 940, the game player's computing system can render the pose based on the movements of the vertices. For example, the game player's computing system can animate the pose based on the deformation of the mesh as well as skin movements associated with the deformation of the mesh.

Overview of Game Engine/Frame Rendering Process

Figure 10:
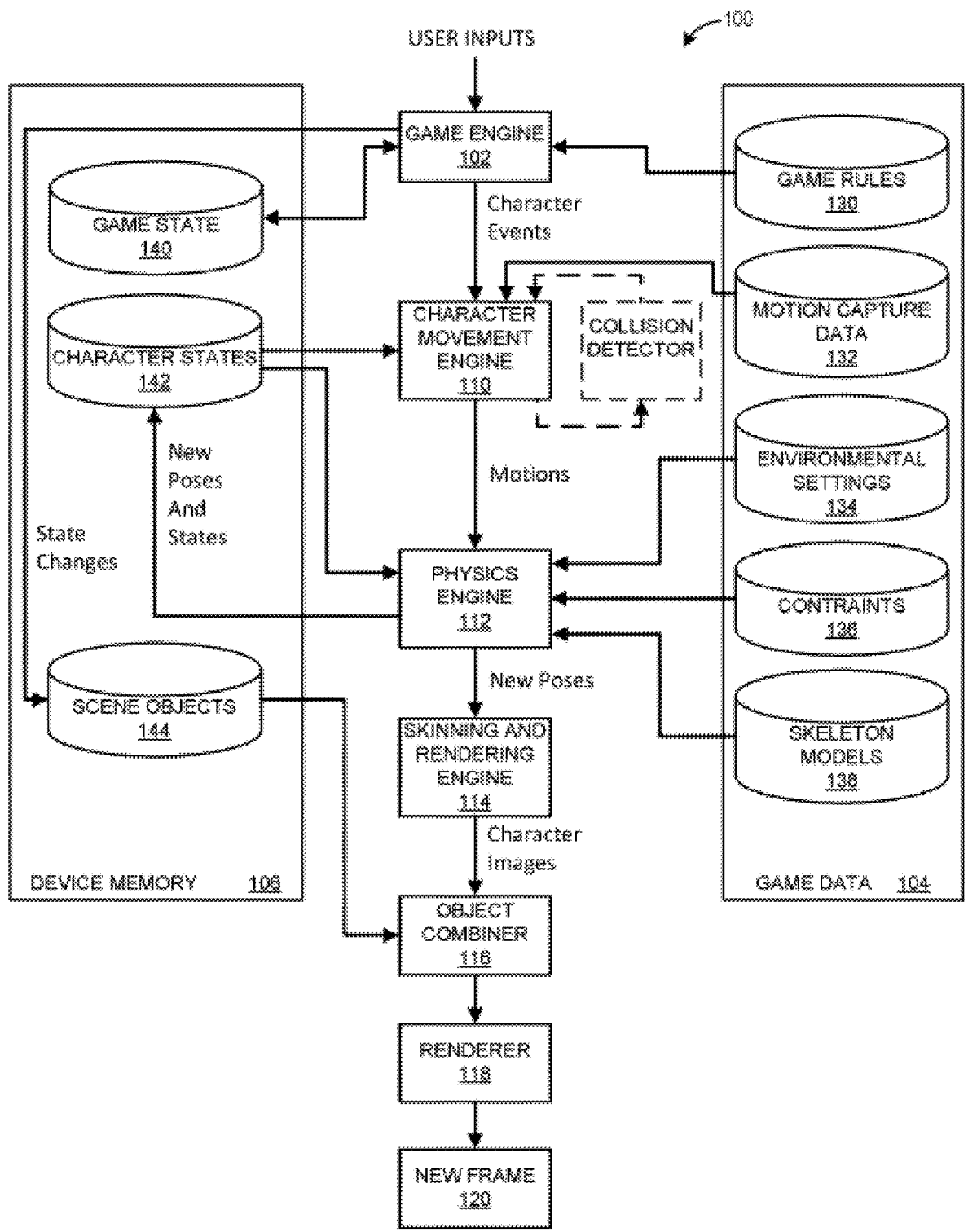
FIG. 10 illustrates an embodiment of elements of a game system.

FIG. 10 illustrates an embodiment of elements of a game system 100, especially those involved in execution of gameplay within a game application. A game device can provide for user input to control aspects of the game according to game rules 130. Game rules 130 might be specified in instruction form on game media 12 (shown in FIG. 11). Examples of game rules 130 include rules for scoring, possible inputs, actions/events, movement in response to inputs, and the like. Other components can control what inputs are accepted and how the game progresses, and other aspects of gameplay. The elements in FIG. 10 illustrate elements used for generating and rendering animation within the game based on various inputs.

As shown in FIG. 10, by system 100, user inputs and game code/data may be used to generate display video. The game system also handles playing the game and presenting corresponding audio output. The description of FIG. 10 is focused on generating frames of display video for the game. A game engine 102 receives the user inputs and determines character events, such as actions, collisions, runs, throws, attacks and other events appropriate for the game.

The character events are conveyed to a character movement engine 110 that determines the appropriate motions the characters should make in response to the events and passes those motions on to a physics engine 112. The physics engine 112 determines new poses for the characters and provides those new poses to a skinning and rendering engine 114. Engine 114 in turn provides character images to an object combiner 116 to combine animate, inanimate and background objects into a full scene. The full scene is conveyed to a renderer 118, which generates a new frame 120 therefrom.

Game data 104 is shown comprising game rules 130, prerecorded motion capture data 132 (such as poses or paths), environmental settings 134, constraints 136 (such as strength and velocity constraints), and skeleton models 138. The device executing the game might have memory 106 for game state 140, character states 142 and scene object storage 144. Character states 142 can comprise storage for a current pose of characters being animated.

During operation, the game engine 102 reads in game rules 130 and considers game state 140 to arrive at character events. The character movement engine 110 reads in prerecorded motion capture data 132 (for example, poses/paths) as well as character states 142. An optional collision detector engine can perform a process that can derive the desired motions for characters based on collisions. Motions might be expressed as a set of external forces, target poses and the like. As needed, the character movement engine 110 may also use other data elements shown, such as skeleton models 138, also referred to as rigs. Rigs are often used in character animations. A typical rig may comprise a collection of character components, such as a skeletal structure and a mesh to be skinned over the skeletal structure. A typical rig comprises a skeletal structure for a character and includes a plurality of degrees of freedom. A rig may also comprise a set of animation controls that enable an animator to move the various components of the character in order to create motion in an animation. The character movement engine 110 might also introduce character movements for randomness, personality, and so forth.

The physics engine 112 inputs the skeleton models of various characters, environmental settings 134, character states such as current poses (for example, positions of body parts expressed as positions, joint angles or other specifications), and velocities (linear and/or angular) of body parts and motions provided by character movement engine 110, which can be in the form of a set of force/torque vectors for some or all body parts. From this information, physics engine 112 generates new poses for the characters using rules of physics and those new poses can be used to update character states 142 and are also provided to the skinning and rendering engine 114. Where invisible skeleton models are used, character states 142 might contain current position of visible "graphics" of characters as well as the invisible rag-doll skeleton characters.

The skinning and rendering engine 114 takes into account the surfaces, colors, and textures of the body parts of posed characters and renders character images. The object combiner 116 can then combine the character images with inanimate and background objects obtained from scene objects store 114 to provide a complete scene to renderer 118.

Overview of a Computing Device

Figure 11:
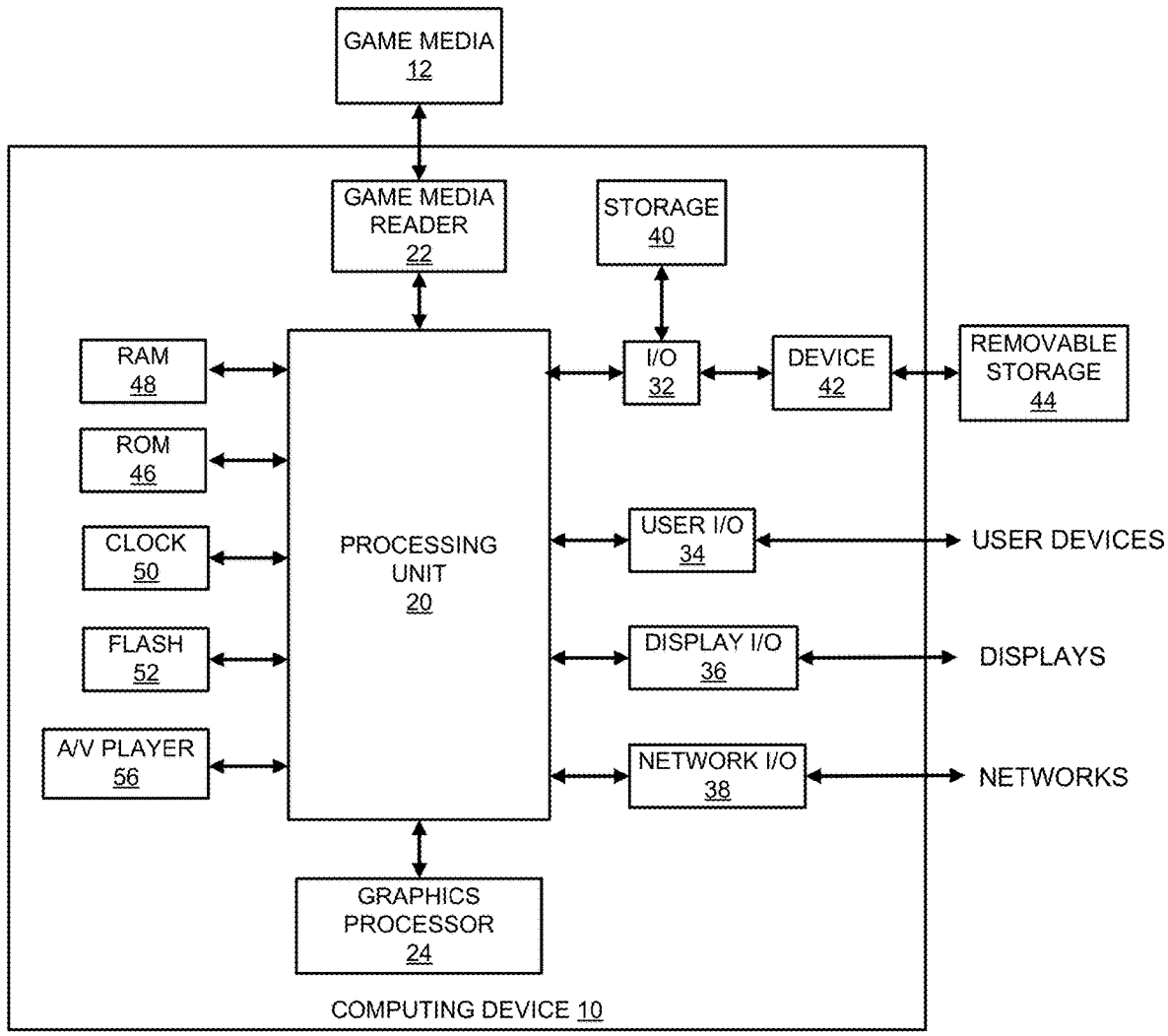
FIG. 11 illustrates an embodiment of a computing device.

FIG. 11 illustrates an embodiment of computing device 10 according to the present disclosure. The computing device 10 can implement various techniques described with reference to FIGS. 1-10. Other variations of the computing device 10 may be substituted for the examples explicitly presented herein, such as removing or adding components to the computing device 10. The computing device 10 may include a game device, a smart phone, a tablet, a personal computer, a laptop, a smart television, a car console display, a server, and the like. The computing device 10 may also be distributed across multiple geographical locations. For example, the computing device 10 may be a cluster of cloud-based servers.

As shown, the computing device 10 includes a processing unit 20 that interacts with other components of the computing device 10 and also external components to computing device 10. A game media reader 22 is included that communicates with game media 12. The game media reader 22 may be an optical disc reader capable of reading optical discs, such as CD-ROMs or DVDs, or any other type of reader that can receive and read data from game media 12.

One or more of the computing devices may be used to implement one or more of the systems disclosed herein.

Computing device 10 may include a separate graphics processor 24. In some cases, the graphics processor 24 may be built into the processing unit 20. In some such cases, the graphics processor 24 may share Random Access Memory (RAM) with the processing unit 20. Alternatively or additionally, the computing device 10 may include a discrete graphics processor 24 that is separate from the processing unit 20. In some such cases, the graphics processor 24 may have separate RAM from the processing unit 20. Computing device 10 might be a handheld game application device, a dedicated game console computing system, a general-purpose laptop or desktop computer, a smart phone, a tablet, a car console, or other suitable system.

Computing device 10 also includes various components for enabling input/output, such as an I/O 32, a user I/O 34, a display I/O 36, and a network I/O 38. I/O 32 interacts with storage element 40 and, through a device 42, removable storage media 44 in order to provide storage for computing device 10. Processing unit 20 can communicate through I/O 32 to store data, such as game state data and any shared data files. In addition to storage 40 and removable storage media 44, computing device 10 is also shown including ROM (Read-Only Memory) 46 and RAM 48. RAM 48 may be used for data that is accessed frequently, such as when a video game is being played.

User I/O 34 is used to send and receive commands between processing unit 20 and user devices, such as game controllers. In some embodiments, the user I/O 34 can include a touchscreen input. The touchscreen can be capacitive touchscreen, a resistive touchscreen, or other type of touchscreen technology that is configured to receive user input through tactile inputs from the player. Display I/O 36 provides input/output functions that are used to display images from the game being played. Network I/O 38 is used for input/output functions for a network. Network I/O 38 may be used during execution of a game, such as when a game is being played online or being accessed online, application of fraud detection, and/or generation of a fraud detection model.

Display output signals produced by display I/O 36 comprise signals for displaying visual content produced by computing device 10 on a display device, such as graphics, user interfaces, video, and/or other visual content. Computing device 10 may comprise one or more integrated displays configured to receive display output signals produced by display I/O 36. According to some embodiments, display output signals produced by display I/O 36 may also be output to one or more display devices external to computing device 10.

The computing device 10 can also include other features that may be used with a video game, such as a clock 50, flash memory 52, and other components. An audio/video player 56 might also be used to play a video sequence, such as a movie. It should be understood that other components may be provided in computing device 10 and that a person skilled in the art will appreciate other variations of computing device 10.

Program code can be stored in ROM 46, RAM 48 or storage 40 (which might comprise a hard disk, other magnetic storage, optical storage, other non-volatile storage or a combination or variation of these). Part of the program code can be stored in ROM that is programmable (ROM, PROM, EPROM, EEPROM, and so forth), and part of the program code can be stored in storage 40, and/or on removable media such as game media 12 (which can be a CD-ROM, cartridge, memory chip or the like, or obtained over a network or other electronic channel as needed). In general, program code can be found embodied in a tangible non-transitory signal-bearing medium.

Random access memory (RAM) 48 (and possibly other storage) is usable to store variables and other game and processor data as needed. RAM 48 is used and holds data that is generated during the execution of an application and portions thereof might also be reserved for frame buffers, application state information, and/or other data needed or usable for interpreting user input and generating display outputs. Generally, RAM 48 is volatile storage and data stored within RAM 48 may be lost when the computing device 10 is turned off or loses power.

As computing device 10 reads game media 12 and provides an application, information may be read from game media 12 and stored in a memory device, such as RAM 48. Additionally, data from storage 40, ROM 46, servers accessed via a network (not shown), or removable storage media 44 may be read and loaded into RAM 48. Although data is described as being found in RAM 48, it will be understood that data does not have to be stored in RAM 48 and may be stored in other memory accessible to processing unit 20 or distributed among several media, such as game media 12 and storage 40.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated, via software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence or can be added, merged, or left out altogether (for example, not all described acts or events are necessary for the practice of the algorithms). Moreover, in certain embodiments, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is understood with the context as used in general to present that an item, term, etc., may be either X, Y, or Z, or any combination thereof (for example, X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure.

What is claimed is:

1. A computer-implemented method for rendering a three-dimensional virtual entity during runtime execution of a game application, comprising:

under control of one or more hardware computing devices configured with specific computer-executable instructions, the specific computer-executable instructions stored in an electronic hardware memory, receiving user input associated with the virtual entity in a virtual environment of the game application, wherein the virtual entity comprises a plurality of blendshapes;

determining movement of a virtual entity based, at least in part, on the user input;

identifying a first pose of a virtual entity for rendering within the virtual environment based on the determined movement;

identifying a compressed blendshape matrix associated with rendering the virtual entity;

accessing the compressed blendshape matrix, wherein the compressed blendshape matrix includes approximated values for a plurality of sub-matrixes of an uncompressed blendshape matrix;

determining movements of a set of the plurality of blendshapes of the virtual entity based on the compressed blendshape matrix by performing, at least, a matrix-vector multiplication and an inverse permutation on individual sub-matrixes of the plurality of sub-matrixes; and rendering the first pose based at least in part on the determined movements of the set of blendshapes.

2. The computer-implemented method of claim 1, wherein a mesh of the virtual entity includes the plurality of blendshapes and a plurality of vertices.

3. The computer-implemented method of claim 2, wherein determining movements of a set of the plurality of blendshapes of the virtual entity includes determining movement vectors of a set of the plurality of vertices associated with the set of blendshapes.

4. The computer-implemented method of claim 3 further comprising calculating a weight vector to achieve the first pose, wherein effects of movement of a plurality of movement vectors are controlled by the weight vector.

5. The computer-implemented method of claim 2, wherein determining movements of a set of the plurality of blendshapes of the virtual entity includes calculating movements of the vertices based on approximated values in the compressed blendshape matrix.

6. The computer-implemented method of claim 5, wherein the movements of the vertices are calculated using $o=n+Bw$, wherein o is a vector containing resulting vertex positions of target blendshapes; w is a vector storing a blending weight of the target blendshapes, n is a neutral shape vector, and B is the compressed blendshape matrix.

7. The computer-implemented method of claim 1 further comprising:

permutating a portion of a weight vector by multiplying with permutation matrixes for respective blocks of the compressed blendshape matrix;

for each block, performing matrix-vector multiplication on each non-zero sub-matrix in a pre-processed matrix associated with the respective sub-matrix, assembling the result of the matrix-vector multiplication for each non-zero sub-matrix of the block into a resulting displacement vector for the respective block; and performing an inverse permutation on the resulting displacement vectors resulting in displacements associated with movements of the vertices.

8. The computer-implemented method of claim 1, wherein each row of the compressed blendshape matrix is associated with a different blendshape and each column is associated with a pose of the virtual entity.

9. The computer-implemented method of claim 8, where values of the compressed matrix correspond to displacements of respective blendshapes with respect to a neutral pose.

10. A computer system comprising:

a hardware processor in communication with the electronic data store, the hardware processor configured to execute specific computer-executable instructions to at least:

receive user input associated with the virtual entity in a virtual environment of the game application, wherein the virtual entity comprises a plurality of blendshapes;

determine movement of a virtual entity based, at least in part, on the user input;

identify a first pose of a virtual entity for rendering within the virtual environment based on the determined movement;

identify a compressed blendshape matrix associated with rendering the virtual entity;

access the compressed blendshape matrix, wherein the compressed blendshape matrix includes approximated values for a plurality of sub-matrixes of an uncompressed blendshape matrix;

determine movements of a set of the plurality of blendshapes of the virtual entity based on the compressed blendshape matrix by performing, at least, a matrix-vector multiplication and an inverse permutation on individual sub-matrixes of the plurality of sub-matrixes; and render the first pose based at least in part on the determined movements of the set of blendshapes.

11. The system of claim 10, wherein a mesh of the virtual entity includes the plurality of blendshapes and a plurality of vertices.

12. The system of claim 11, wherein when determining movements of a set of the plurality of blendshapes of the virtual entity, the computer-executable instructions further configure the hardware processor to determine movement vectors of a set of the plurality of vertices associated with the set of blendshapes.

13. The system of claim 12, wherein the computer-executable instructions further configure the hardware processor to calculate a weight vector to achieve the first pose, wherein effects of movement of a plurality of movement vectors are controlled by the weight vector.

14. The system of claim 11, wherein when determining movements of a set of the plurality of blendshapes of the virtual entity the computer-executable instructions further configure the hardware processor to calculate movements of the vertices based on approximated values in the compressed blendshape matrix.

15. The system of claim 14, wherein the movements of the vertices are calculated using $o=n+Bw$, wherein o is a vector containing resulting vertex positions of target blendshapes; w is a vector storing a blending weight of the target blendshapes, n is a neutral shape vector, and B is the compressed blendshape matrix.

16. The system of claim 10, wherein the computer-executable instructions further configure the hardware processor to:
   permutate a portion of a weight vector by multiplying with permutation matrixes for respective blocks of the compressed blendshape matrix;
   for each block,
      perform matrix-vector multiplication on each non-zero sub-matrix in a pre-processed matrix associated with the respective sub-matrix, and
      assemble the result of the matrix-vector multiplication for each non-zero sub-matrix of the block into a resulting displacement vector for the respective block; and
   perform an inverse permutation on the resulting displacement vectors resulting in displacements associated with movements of the vertices.

17. The system of claim 10, wherein each row of the compressed blendshape matrix is associated with a different blendshape and each column is associated with a pose of the virtual entity.

18. The system of claim 17, wherein values of the compressed matrix correspond to displacements of respective blendshapes with respect to a neutral pose.

* * * * *